US012776782B2

(12) United States Patent
Kesavan et al.

(10) Patent No.: US 12,776,782 B2
(45) Date of Patent: Oct. 27, 2026

(54) FILE SYSTEM FORMAT FOR PERSISTENT MEMORY

(71) Applicant: NetApp, Inc., San Jose, CA (US)

(72) Inventors: Ram Kesavan, Los Altos, CA (US); Matthew Fontaine Curtis-Maury, Apex, NC (US); Abdul Basit, Morrisville, NC (US); Vinay Devadas, Apex, NC (US); Ananthan Subramanian, San Ramon, CA (US); Mark Smith, Cupertino, CA (US)

(73) Assignee: NetApp, Inc., San Jose, CA (US)

( * ) Notice: Subject to any disclaimer, the term of this patent is extended or adjusted under 35 U.S.C. 154(b) by 170 days.

(21) Appl. No.: 18/914,423

(22) Filed: Oct. 14, 2024

(65) Prior Publication Data

US 2025/0038756 A1 Jan. 30, 2025

Related U.S. Application Data

(63) Continuation of application No. 18/186,657, filed on Mar. 20, 2023, now Pat. No. 12,119,836, which is a (Continued)

(51) Int. Cl.
*H03M 1/12* (2006.01)
*G06F 3/06* (2006.01)
(Continued)

(52) U.S. Cl.
CPC ........ *H03M 1/0687* (2013.01); *G06F 3/0604* (2013.01); *G06F 3/0653* (2013.01); (Continued)

(58) Field of Classification Search
CPC ............. H03M 1/0687; H03M 1/0695; G06F 3/0604; G06F 3/0653; G06F 3/0685; (Continued)

(56) References Cited

U.S. PATENT DOCUMENTS 7,761,444 B2 7/2010 Zhang et al.
8,417,903 B2 4/2013 Alvarez et al.
(Continued)

OTHER PUBLICATIONS

Notice of Allowance mailed on Jun. 13, 2024 for U.S. Appl. No. 18/186,657, filed Mar. 20, 2023, 07 pages.

*Primary Examiner* — Jean B Jeanglaude
(74) *Attorney, Agent, or Firm* — COOPER LEGAL GROUP LLC

(57) ABSTRACT

Techniques are provided for implementing a file system format for persistent memory. A node, comprising persistent memory, receives an operation comprising a file identifier and file system instance information. A list of file system info objects are evaluated to identify a file system info object matching the file system instance information. An inofile, identified by the file system info object as being associated with inodes of files within an instance of the file system targeted by the operation, is traversed to identify an inode matching the file identifier. If the inode comprises an indicator that the file is tiered into the persistent memory, then the inode it utilized to facilitate execution of the operation upon the persistent memory. Otherwise, the operation is routed to a storage file system tier for execution by a storage file system upon storage associated with the node.

20 Claims, 9 Drawing Sheets

Related U.S. Application Data continuation of application No. 17/364,946, filed on Jul. 1, 2021, now Pat. No. 11,611,348, which is a continuation of application No. 16/852,586, filed on Apr. 20, 2020, now Pat. No. 11,063,601.

(51) Int. Cl.
*G06F 16/901* (2019.01)
*H03M 1/06* (2006.01)

(52) U.S. Cl.
CPC ........ *G06F 3/0685* (2013.01); *G06F 16/9027* (2019.01); *H03M 1/0695* (2013.01)

(58) Field of Classification Search
CPC .... G06F 16/9027; G06F 3/061; G06F 3/0643; G06F 16/14; G06F 16/13
See application file for complete search history.

(56) References Cited

U.S. PATENT DOCUMENTS

| | | | | |
|---|---|---|---|---|
| 8,832,142 | B2 | 9/2014 | Marwah et al. | |
| 9,342,528 | B2 | 5/2016 | Clash et al. | |
| 9,378,232 | B2 | 6/2016 | Mukherjee et al. | |
| 9,519,664 | B1 | 12/2016 | Kharatishvili et al. | |
| 9,535,855 | B2 | 1/2017 | Epstein | |
| 9,916,258 | B2 | 3/2018 | Mitra et al. | |
| 9,946,735 | B2 | 4/2018 | Kharatishvili et al. | |
| 10,176,036 | B2 | 1/2019 | Haridas et al. | |
| 10,359,972 | B2 * | 7/2019 | Joshi | G06F 3/0689 |
| 10,387,686 | B2 | 8/2019 | Boivie et al. | |
| 10,664,462 | B2 | 5/2020 | Gurajada et al. | |
| 10,802,836 | B2 | 10/2020 | Parhar et al. | |
| 10,922,296 | B2 * | 2/2021 | Gurajada | G06F 16/22 |
| 11,063,601 | B1 | 7/2021 | Kesavan et al. | |
| 11,611,348 | B2 | 3/2023 | Kesavan et al. | |
| 12,119,836 | B2 | 10/2024 | Kesavan | |
| 2011/0016093 | A1 * | 1/2011 | Clark | G06F 11/1453 711/E12.001 |
| 2011/0016157 | A1 * | 1/2011 | Bear | G06F 16/22 707/804 |
| 2011/0106863 | A1 | 5/2011 | Mamidi et al. | |
| 2016/0171023 | A1 | 6/2016 | Konik et al. | |
| 2016/0334997 | A1 | 11/2016 | Wang et al. | |
| 2017/0046096 | A1 | 2/2017 | Graefe et al. | |
| 2017/0192892 | A1 | 7/2017 | Pundir et al. | |
| 2018/0095845 | A1 | 4/2018 | Sanakkayala et al. | |
| 2018/0095855 | A1 | 4/2018 | Sanakkayala et al. | |
| 2018/0253468 | A1 | 9/2018 | Gurajada et al. | |
| 2018/0349374 | A1 | 12/2018 | Gurajada et al. | |
| 2018/0349424 | A1 | 12/2018 | Gurajada et al. | |
| 2019/0220528 | A1 | 7/2019 | Cruciani et al. | |
| 2019/0324880 | A1 | 10/2019 | Rose | |
| 2019/0377743 | A1 | 12/2019 | Gupta | |
| 2020/0026659 | A1 | 1/2020 | Olderdissen et al. | |
| 2020/0127937 | A1 | 4/2020 | Busick et al. | |
| 2023/0336183 | A1 | 10/2023 | Kesavan | |

* cited by examiner

FILE SYSTEM FORMAT FOR PERSISTENT MEMORY

RELATED APPLICATIONS

This application claims priority to and is a continuation of U.S. application Ser. No. 18/186,657, filed on Mar. 20, 2023, titled "FILE SYSTEM FORMAT FOR PERSISTENT MEMORY," which claims priority to and is a continuation of U.S. Pat. No. 11,611,348, filed on Jul. 1, 2021, titled "FILE SYSTEM FORMAT FOR PERSISTENT MEMORY," which claims priority to and is a continuation of U.S. Pat. No. 11,063,601, filed on Apr. 20, 2020, titled "FILE SYSTEM FORMAT FOR PERSISTENT MEMORY," which are incorporated herein by reference.

BACKGROUND

A node, such as a server, a computing device, a virtual machine, etc., may host a storage operating system. The storage operating system may be configured to store data on behalf of client devices, such as within volumes, aggregates, storage devices, cloud storage, locally attached storage, etc. In this way, a client can issue a read operation or a write operation to the storage operating system of the node in order to read data from storage or write data to the storage. The storage operating system may implement a storage file system through which the data is organized and accessible to the client devices. The storage file system may be tailored for managing the storage and access of data within block-addressable storage media such as hard drives, solid state drives, and/or other storage that may be relatively slower than memory or other types of faster and lower latency storage having a different access characteristic than block-based access such as cloud storage. Unfortunately, the storage file system may be unable to adequately utilize these faster types of storage for storing and providing access to client data because the storage file system cannot leverage the relatively faster access characteristics of such storage. Furthermore, the storage file system may be tailored for block-addressable types of storage. That is, the storage file system may utilize data structures and functionality tailored for block based persistent media, such as disk drives, solid state drives, etc. However, other types of storage may be byte-addressable, and thus the storage file system may be unable to store data within such types of storage due to the different access characteristics of these types of byte-addressable storage in terms of performance and persistence semantics.

DETAILED DESCRIPTION

Figure 1:
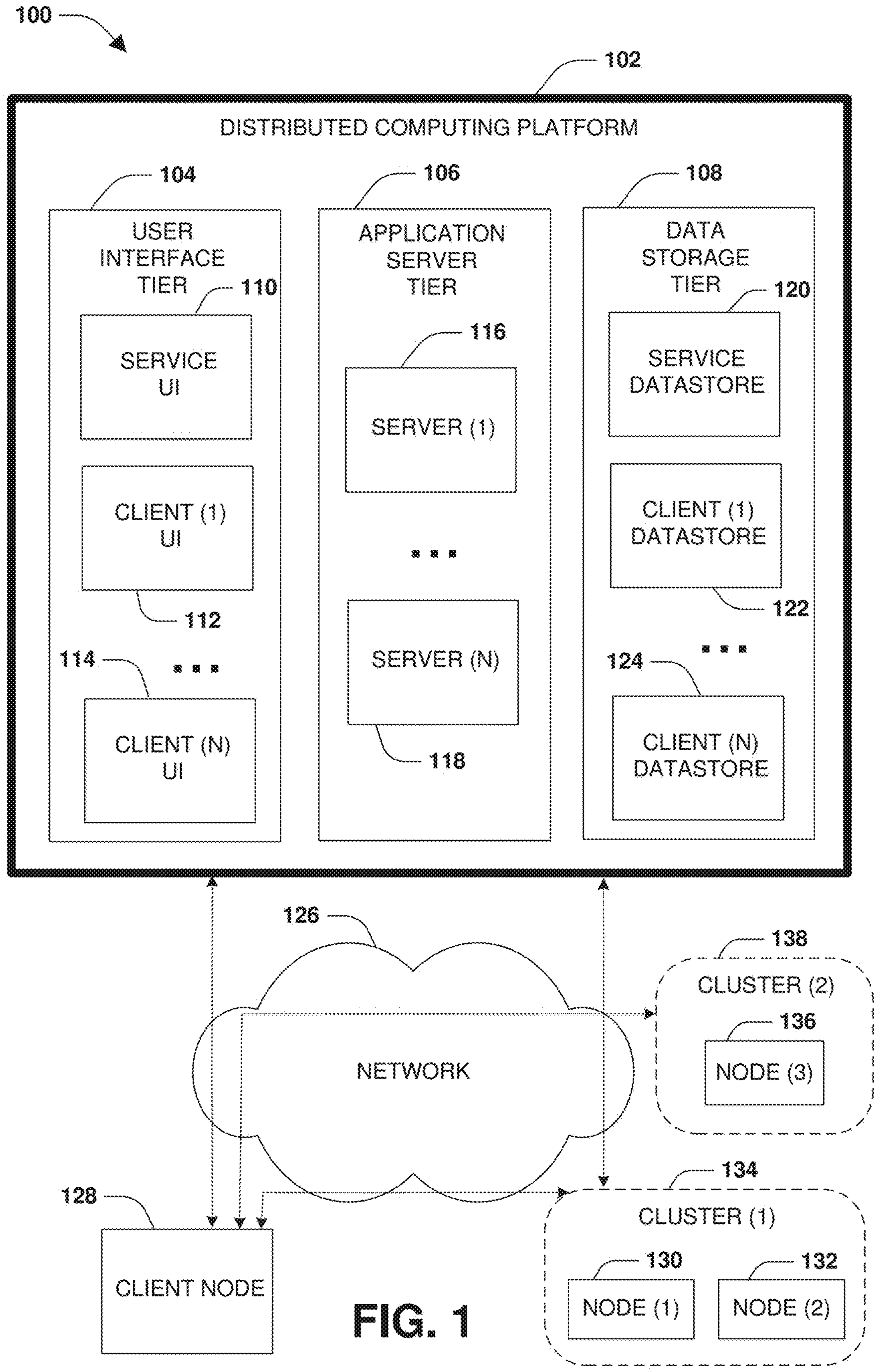
FIG. 1 is a block diagram illustrating an example computing environment in which an embodiment of the invention may be implemented.

Some examples of the claimed subject matter are now described with reference to the drawings, where like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. Nothing in this detailed description is admitted as prior art.

A node may be implemented as a computing device, a server, an on-premise device, a virtual machine, hardware, software, or combination thereof. The node may be configured to manage storage on behalf of client devices using a storage environment, such as hard drives, solid state drives, cloud storage, or other types of storage within which client data may be stored through volumes, aggregates, cloud storage objects, etc. The node may manage this storage utilizing a storage operating system that can provide data protection and storage efficiency for the client data. For example, the storage operation system may implement and/or interact with storage services that can provide snapshot functionality, data migration functionality, compression, deduplication, encryption, backup and restore, cloning, synchronous and/or asynchronous replication, data mirroring, and/or other functionality for efficiently storing, protecting, and managing client data. The node may implement a storage file system through the storage operating system for organizing and managing the client data. In this way, a client device can connect to the node in order to access the client data through the storage file system. The storage file system may be tailored to access and store data within block-addressable storage media, such as disk drives, solid state drives, etc. The storage file system may utilize data structures and/or functionality tailored to locate, store, and retrieve client data from blocks within the block-addressable storage media.

As new types of storage media become available, it may be advantageous to leverage such storage media for use by the node for storing client data. However, the storage file system may not be tailored to leverage certain types of storage media because the storage file system may have been created and tailored to only be capable of managing the storage of client data within block-addressable storage media, such as within hard drives, solid state drives, disk drives, etc. Thus, the storage file system may be unable to utilize these newer and faster types of storage media, such as persistent memory (pmem), that have different storage semantics than block-based storage. Persistent memory provides relatively lower latency and faster access speeds than block-addressable storage media, such as disk drives and solid state drives, that the storage file system is natively tailored to manage. Because the persistent memory is byte-addressable instead of block-addressable, the storage file system, data structures of the storage file system used to locate data within the block-addressable storage media, and the commands used to store and retrieved data from the block-addressable storage media cannot be leveraged for the byte-addressable persistent memory.

Accordingly, as provided herein, a file system format is implemented with data structures and functionality such as commands for accessing and managing a persistent memory storage tier comprised of byte-addressable persistent memory of a node. This file system format also enables the ability to capture snapshots of volumes and file clones of files whose data or portions thereof may be stored within the persistent memory (e.g., volume snapshots and file clones may be captured of volumes and files whose data is at least partially stored or completely stored within the persistent memory). The file system format provides a tiering solution for storage managed by a storage operating system of a node, such that data may be tiered between the storage such as block-addressable storage and the persistent memory (i.e., byte-addressable storage). The file system format is used by the persistent memory storage tier as a file system tailored for byte-addressable storage in order to access the persistent memory for storing and retrieving data. The persistent memory storage tier is hosted at a level within a storage operating system storage stack above a storage file system tier used to manage the storage file system that stores data within block-addressable storage, such as disk drives and solid state storage.

The file system format is implemented as the file system tailored to work properly with the block-addressable semantics of the persistent memory having an address space arranged into a contiguous set of pages, such as 4 KB pages or any other size of pages within the persistent memory. In an embodiment, page (0) is left unused. Page (0) is left unused so that if a data structure (e.g., an indirect page, a per-page struct, etc.) references page (0) by accident, then this mistake can be easily identified. Page (1) comprises a file system superblock. The file system superblock is a root of a file system tree of the file system for the persistent memory. A duplicate copy of the file system superblock is maintained within another page of the persistent memory. In an embodiment, the duplicate copy of the file system superblock is maintained at a page that is indexed a threshold number of pages from the page (1), such as at least 10 pages, 20 pages, 100 pages, a last page, or any other threshold number of pages away from the page (1). In this way, if something happens to page (1) that results in a loss of the file system superblock, then the duplicate copy of the file system superblock would still be available so that the root of the file system tree is not lost. It may be appreciated that any number of duplicate copies of the file system superblock may be maintained at any page within the persistent memory.

The file system superblock comprises a location of a list of file system info objects. In an embodiment, the list of file system info objects is a linked list of pages within the persistent memory, where each page contains a set of file system info objects. If there are more file system info objects than what can be stored within a single page (e.g., a single 4 kb page), then the remaining file system info objects are stored within one or more additional pages within the persistent memory (e.g., within a second 4 kb page). Each page will contain a location of a next page comprising file system info objects. Each file system info object defines a file system instance for a volume, such as an active file system of the volume or snapshots of the volume. Each file system info object comprises a persistent memory location of a root of an inofile (a page tree) comprising inodes of files of the file system instance defined by a file system info object. Each file system instance will have its own inofile of inodes for that file system instance. An inode comprises metadata about a corresponding file of the file system instance. The inofile may comprise indirect pages (intermediate nodes in the page tree) and direct blocks (leaf nodes in the page tree).

The direct blocks of the inofile are logically arranged as an array of the inodes indexed by file identifiers of each file represented by the inodes. Each inode stores a location of a root of a file tree for a given file. Direct blocks of the file tree of the file (leaf nodes) comprise the actual user data stored within the file. Each indirect page of the file tree of the file (intermediate nodes) comprises 512 indirect entries or any other number of indirect entries. The indirect entries are used to find a page's child page for a given offset in a user file or the inofile. That is, an indirect entry (a page) comprises a reference to a block/node (a child page) one level lower within a page tree or file tree. An inode of a file points to a single inode root indirect page. This inode root indirect page can point to either direct blocks comprising file data if the 512 indirect entries are sufficient to index all pages of the file. Else, the inode root indirect page points to a next level down of indirect pages.

A size of a file determines the number of levels of indirect pages. For example, the pages are arranged as the file tree with one or more levels, such that the lowest level comprises direct blocks of user data and levels above the lowest level are indirect levels of indirect pages with pointers to blocks in a level below. In an embodiment, the file tree may be a balanced tree where the direct blocks of user data are all the same distance from the root of the file tree. A given offset in a file for a page is at a fixed path down the file tree based upon that offset. Only files that have been selected for tiering will be present in the persistent memory, and only data present in the persistent memory will have direct blocks in the file tree of the file, and thus an indirect page may lack a reference to a direct block if that block is not present in persistent memory, or comprise an indicator of such. When a page is removed from the persistent memory, the page will be effectively removed from the file tree by a scavenging process.

A per-page structure is used to track metadata about each page within the persistent memory. Each page will correspond to a single per-page structure that tracks/stores metadata about the page. In an embodiment, the per-page structures are stored in an array within the persistent memory, sized one entry within the array per page. Per-page structures correspond to file superblock pages, file system info pages, indirect pages of the inofile, user data pages, per-page structure array pages, etc. The persistent memory can be viewed as an array of pages (e.g., 4 kb pages or any other size of pages) indexed by page block numbers, which may be tracked by the per-page structures.

In an embodiment of implementing per-page structure to page mappings (e.g., mappings of a per-page structure to a physical page within the persistent memory) using a one-to-one mapping, a per-page structure for a page can be fixed at a page block number offset within a per-page structure table. In an embodiment of implementing per-page structure to page mappings using a variable mapping, a per-page structure of a page stores the page block number of the page represented by the per-page structure. With the variable mapping, persistent memory objects, such as those stored within the file system superblock to point to the list of file system info objects, within a file system info object to point to the root of the inofile, within an inode to point to a root of a file tree of a file, and within indirect pages to point to child blocks (child pages) will store a per-page structure ID of its per-page structure as a location of the page being pointed to, and will redirect through the per-page structure using the per-page structure ID to identify the physical block number of the page being pointed to. Thus, an indirect entry of an indirect page will comprise a per-page structure ID that can be used to identify a per-page structure having a physical block number of the page pointed to by the indirect page.

An indirect entry will comprise a generation count of a page being pointed to by the indirect entry. Each per-page structure will also store a generation count, which is incremented each time a corresponding page is scavenged where the page is evicted from the persistent memory. When a page is linked into a parent indirect page (an indirect entry), the per-page structure ID is set and a current generation count is set. As the persistent memory becomes full, pages must be scavenged (evicted) for reuse as other data and/or metadata. Instead of a scavenging process having to locate a page's parent linking to the page, zeroing out the per-page structure ID, and updating a checksum, the generation count within the per-page structure is simply increased. Any code and commands that walk the file system tree will first check for generation count mismatch between a generation count within an indirect entry and a generation count within the per-page structure. If there is a mismatch, then the code and commands will know that the page being pointed to has been scavenged and evicted from the persistent memory. Thus, in a single step, all references to the scavenged page will be invalidated because the generation count in all of the indirect pages referencing the scavenged page will not match the increased generation count within the per-page structure.

In an embodiment, a generation count of a child page pointed to by an indirect entry of an indirect page is stored within a generation count field within the indirect entry. A per-page structure ID of a per-page structure for the child page pointed to by the indirect entry of the indirect page is stored within a per-page structure field within the indirect entry. The generation count field and the per-page structure field may be stored within 8 bytes of the indirect entry so that the generation count field and the per-page structure field are 8 byte aligned. This allows the generation count field and the per-page structure field to be atomically set together, such that either both fields will successfully be set or both fields will fail to be set such as in the event of a crash or failure so that there is no partial modification of either field (e.g., both fields can be set by a single operation to the persistent memory). This prevents data loss that would otherwise occur if only one or the other or portions thereof of the generation count field and/or the per-page structure field are updated before the crash or failure. In an example of updating the fields based upon a copy-on-write operation of a page, a parent indirect entry of the page is updated to reflect a new per-page structure ID and generation count of the page targeted by the copy-on-write operation.

A per-page structure of a page may comprise additional metadata information. In an embodiment, the per-page structure comprises a checksum of content in the page. When the page is updated in place by a first transaction, the checksum may be updated by a second transaction. If the second transaction does not complete due to a crash, then the existing checksum may not match the data. However, this does not necessarily imply a corruption since that data was updated by the first transaction. Thus, the second transaction can be tried again after recovery from the crash. In an embodiment, the per-page structure comprises a reference count to the page. The reference count may correspond to how many references to the page there are by an active file system of a volume, volume snapshots of the volume, and file clones of a file whose data is stored within the page. In an example, the file system for the persistent memory may utilize hierarchical reference counting to support volume snapshots and file clones. Thus, a hierarchical reference on the page may be stored within the per-page structure.

In an embodiment, the per-page structure comprises a page state of the page. The page state may be a free state indicating that the page is not in use (e.g., no data is stored within the page). The page state may be a read cached state indicating that content of the page stored within the persistent memory by the file system matches corresponding content maintained by the storage file system within storage of the node. In this way, the read cached state may be an indication that a copy of the corresponding content has been cached within the page of the persistent memory. The page state may be a dirty state indicating that the content of the page stored within the persistent memory by the file system does not match corresponding content maintained by the storage file system within storage of the node. Thus, if the page is scavenged while having the dirty state, the content of the page is flushed from the persistent memory and is tiered out through the storage file system for storage within the storage managed by the storage file system.

In an embodiment, the file system format of the file system for the persistent memory may define what persistent metadata is not tracked. For example, on boot of the node, the information about the pages within the persistent memory can be determined based upon the page states of the pages. Pages having the free state are linked on a list of free pages. In-use pages (e.g., pages having the read cached state or the dirty state) may be linked on a list of in-use pages, which may be used to scavenge cold pages (e.g., pages whose content have not been accessed for a threshold time period, and thus can be removed from persistent memory and tiered out through the storage file system for storage within the storage managed by the storage file system). In an example, the lists may be volatile in that the lists may be cleared/zeroed out and repopulated upon reboot of the node. In an example, the lists may be stored within the persistent memory.

In an embodiment, the node may be paired with a partner node. The partner node may comprise a partner persistent memory. The persistent memory of the node may be partitioned into a local partition used to store data by the node and a remote partition into which data of the partner persistent memory of the partner node is mirrored. The partner persistent memory of the partner node may be partitioned into a local partition used to store data by the partner node and a remote partition into which data of the persistent memory of the node is mirrored. Thus, if one of the nodes fail, then the surviving node can take over the processing of subsequent I/O in place of the failed node using up-to-date data within the remote partition of its persistent memory.

FIG. 1 is a diagram illustrating an example operating environment 100 in which an embodiment of the techniques described herein may be implemented. In one example, the techniques described herein may be implemented within a client device 128, such as a laptop, a tablet, a personal computer, a mobile device, a server, a virtual machine, a wearable device, etc. In another example, the techniques described herein may be implemented within one or more nodes, such as a first node 130 and/or a second node 132 within a first cluster 134, a third node 136 within a second cluster 138, etc. A node may comprise a storage controller, a server, an on-premise device, a virtual machine such as a storage virtual machine, hardware, software, or combination thereof. The one or more nodes may be configured to manage the storage and access to data on behalf of the client device 128 and/or other client devices. In another example, the techniques described herein may be implemented within a distributed computing platform 102 such as a cloud computing environment (e.g., a cloud storage environment, a multi-tenant platform, a hyperscale infrastructure comprising scalable server architectures and virtual networking, etc.) configured to manage the storage and access to data on behalf of client devices and/or nodes.

In yet another example, at least some of the techniques described herein are implemented across one or more of the client device 128, the one or more nodes 130, 132, and/or 136, and/or the distributed computing platform 102. For example, the client device 128 may transmit operations, such as data operations to read data and write data and metadata operations (e.g., a create file operation, a rename directory operation, a resize operation, a set attribute operation, etc.), over a network 126 to the first node 130 for implementation by the first node 130 upon storage. The first node 130 may store data associated with the operations within volumes or other data objects/structures hosted within locally attached storage, remote storage hosted by other computing devices accessible over the network 126, storage provided by the distributed computing platform 102, etc. The first node 130 may replicate the data and/or the operations to other computing devices, such as to the second node 132, the third node 136, a storage virtual machine executing within the distributed computing platform 102, etc., so that one or more replicas of the data are maintained. For example, the third node 136 may host a destination storage volume that is maintained as a replica of a source storage volume of the first node 130. Such replicas can be used for disaster recovery and failover.

In an embodiment, the techniques described herein are implemented by a storage operating system or are implemented by a separate module that interacts with the storage operating system. The storage operating system may be hosted by the client device, 128, a node, the distributed computing platform 102, or across a combination thereof. In an example, the storage operating system may execute within a storage virtual machine, a hyperscaler, or other computing environment. The storage operating system may implement a storage file system to logically organize data within storage devices as one or more storage objects and provide a logical/virtual representation of how the storage objects are organized on the storage devices. A storage object may comprise any logically definable storage element stored by the storage operating system (e.g., a volume stored by the first node 130, a cloud object stored by the distributed computing platform 102, etc.). Each storage object may be associated with a unique identifier that uniquely identifies the storage object. For example, a volume may be associated with a volume identifier uniquely identifying that volume from other volumes. The storage operating system also manages client access to the storage objects.

The storage operating system may implement a file system for logically organizing data. For example, the storage operating system may implement a write anywhere file layout for a volume where modified data for a file may be written to any available location as opposed to a write-in-place architecture where modified data is written to the original location, thereby overwriting the previous data. In an example, the file system may be implemented through a file system layer that stores data of the storage objects in an on-disk format representation that is block-based (e.g., data is stored within 4 kilobyte blocks and inodes are used to identify files and file attributes such as creation time, access permissions, size and block location, etc.).

In an example, deduplication may be implemented by a deduplication module associated with the storage operating system. Deduplication is performed to improve storage efficiency. One type of deduplication is inline deduplication that ensures blocks are deduplicated before being written to a storage device. Inline deduplication uses a data structure, such as an incore hash store, which maps fingerprints of data to data blocks of the storage device storing the data. Whenever data is to be written to the storage device, a fingerprint of that data is calculated and the data structure is looked up using the fingerprint to find duplicates (e.g., potentially duplicate data already stored within the storage device). If duplicate data is found, then the duplicate data is loaded from the storage device and a byte by byte comparison may be performed to ensure that the duplicate data is an actual duplicate of the data to be written to the storage device. If the data to be written is a duplicate of the loaded duplicate data, then the data to be written to disk is not redundantly stored to the storage device. Instead, a pointer or other reference is stored in the storage device in place of the data to be written to the storage device. The pointer points to the duplicate data already stored in the storage device. A reference count for the data may be incremented to indicate that the pointer now references the data. If at some point the pointer no longer references the data (e.g., the deduplicated data is deleted and thus no longer references the data in the storage device), then the reference count is decremented. In this way, inline deduplication is able to deduplicate data before the data is written to disk. This improves the storage efficiency of the storage device.

Background deduplication is another type of deduplication that deduplicates data already written to a storage device. Various types of background deduplication may be implemented. In an example of background deduplication, data blocks that are duplicated between files are rearranged within storage units such that one copy of the data occupies physical storage. References to the single copy can be inserted into a file system structure such that all files or containers that contain the data refer to the same instance of the data. Deduplication can be performed on a data storage device block basis. In an example, data blocks on a storage device can be identified using a physical volume block number. The physical volume block number uniquely identifies a particular block on the storage device. Additionally, blocks within a file can be identified by a file block number. The file block number is a logical block number that indicates the logical position of a block within a file relative to other blocks in the file. For example, file block number 0 represents the first block of a file, file block number 1 represents the second block, etc. File block numbers can be mapped to a physical volume block number that is the actual data block on the storage device. During deduplication operations, blocks in a file that contain the same data are deduplicated by mapping the file block number for the block to the same physical volume block number, and maintaining a reference count of the number of file block numbers that map to the physical volume block number. For example, assume that file block number 0 and file block number 5 of a file contain the same data, while file block numbers 1-4 contain unique data. File block numbers 1-4 are mapped to different physical volume block numbers. File block number 0 and file block number 5 may be mapped to the same physical volume block number, thereby reducing storage requirements for the file. Similarly, blocks in different files that contain the same data can be mapped to the same physical volume block number. For example, if file block number 0 of file A contains the same data as file block number 3 of file B, file block number 0 of file A may be mapped to the same physical volume block number as file block number 3 of file B.

In another example of background deduplication, a changelog is utilized to track blocks that are written to the storage device. Background deduplication also maintains a fingerprint database (e.g., a flat metafile) that tracks all unique block data such as by tracking a fingerprint and other filesystem metadata associated with block data. Background deduplication can be periodically executed or triggered based upon an event such as when the changelog fills beyond a threshold. As part of background deduplication, data in both the changelog and the fingerprint database is sorted based upon fingerprints. This ensures that all duplicates are sorted next to each other. The duplicates are moved to a dup file. The unique changelog entries are moved to the fingerprint database, which will serve as duplicate data for a next deduplication operation. In order to optimize certain filesystem operations needed to deduplicate a block, duplicate records in the dup file are sorted in certain filesystem sematic order (e.g., inode number and block number). Next, the duplicate data is loaded from the storage device and a whole block byte by byte comparison is performed to make sure duplicate data is an actual duplicate of the data to be written to the storage device. After, the block in the changelog is modified to point directly to the duplicate data as opposed to redundantly storing data of the block.

In an example, deduplication operations performed by a data deduplication layer of a node can be leveraged for use on another node during data replication operations. For example, the first node 130 may perform deduplication operations to provide for storage efficiency with respect to data stored on a storage volume. The benefit of the deduplication operations performed on first node 130 can be provided to the second node 132 with respect to the data on first node 130 that is replicated to the second node 132. In some aspects, a data transfer protocol, referred to as the LRSE (Logical Replication for Storage Efficiency) protocol, can be used as part of replicating consistency group differences from the first node 130 to the second node 132. In the LRSE protocol, the second node 132 maintains a history buffer that keeps track of data blocks that it has previously received. The history buffer tracks the physical volume block numbers and file block numbers associated with the data blocks that have been transferred from first node 130 to the second node 132. A request can be made of the first node 130 to not transfer blocks that have already been transferred. Thus, the second node 132 can receive deduplicated data from the first node 130, and will not need to perform deduplication operations on the deduplicated data replicated from first node 130.

In an example, the first node 130 may preserve deduplication of data that is transmitted from first node 130 to the distributed computing platform 102. For example, the first node 130 may create an object comprising deduplicated data. The object is transmitted from the first node 130 to the distributed computing platform 102 for storage. In this way, the object within the distributed computing platform 102 maintains the data in a deduplicated state. Furthermore, be preserved when deduplicated data is deduplication may transmitted/replicated/mirrored between the client device 128, the first node 130, the distributed computing platform 102, and/or other nodes or devices.

In an example, compression may be implemented by a compression module associated with the storage operating system. The compression module may utilize various types of compression techniques to replace longer sequences of data (e.g., frequently occurring and/or redundant sequences) with shorter sequences, such as by using Huffman coding, arithmetic coding, compression dictionaries, etc. For example, an uncompressed portion of a file may comprise "ggggnnnnnnqqqqqqqqqq", which is compressed to become "4g6n10q". In this way, the size of the file can be reduced to improve storage efficiency. Compression may be implemented for compression groups. A compression group may correspond to a compressed group of blocks. The compression group may be represented by virtual volume block numbers. The compression group may comprise contiguous or non-contiguous blocks.

Compression may be preserved when compressed data is transmitted/replicated/mirrored between the client device 128, a node, the distributed computing platform 102, and/or other nodes or devices. For example, an object may be created by the first node 130 to comprise compressed data. The object is transmitted from the first node 130 to the distributed computing platform 102 for storage. In this way, the object within the distributed computing platform 102 maintains the data in a compressed state.

In an example, various types of synchronization may be implemented by a synchronization module associated with the storage operating system. In an example, synchronous replication may be implemented, such as between the first node 130 and the second node 132. It may be appreciated that the synchronization module may implement synchronous replication between any devices within the operating environment 100, such as between the first node 130 of the first cluster 134 and the third node 136 of the second cluster 138 and/or between a node of a cluster and an instance of a node or virtual machine in the distributed computing platform 102.

As an example, during synchronous replication, the first node 130 may receive a write operation from the client device 128. The write operation may target a file stored within a volume managed by the first node 130. The first node 130 replicates the write operation to create a replicated write operation. The first node 130 locally implements the write operation upon the file within the volume. The first node 130 also transmits the replicated write operation to a synchronous replication target, such as the second node 132 that maintains a replica volume as a replica of the volume maintained by the first node 130. The second node 132 will execute the replicated write operation upon the replica volume so that file within the volume and the replica volume comprises the same data. After, the second node 132 will transmit a success message to the first node 130. With synchronous replication, the first node 130 does not respond with a success message to the client device 128 for the write operation until both the write operation is executed upon the volume and the first node 130 receives the success message that the second node 132 executed the replicated write operation upon the replica volume.

In another example, asynchronous replication may be implemented, such as between the first node 130 and the third node 136. It may be appreciated that the synchronization module may implement asynchronous replication between any devices within the operating environment 100, such as between the first node 130 of the first cluster 134 and the distributed computing platform 102. In an example, the first node 130 may establish an asynchronous replication relationship with the third node 136. The first node 130 may capture a baseline snapshot of a first volume as a point in time representation of the first volume. The first node 130 may utilize the baseline snapshot to perform a baseline transfer of the data within the first volume to the third node

136 in order to create a second volume within the third node 136 comprising data of the first volume as of the point in time at which the baseline snapshot was created.

After the baseline transfer, the first node 130 may subsequently create snapshots of the first volume over time. As part of asynchronous replication, an incremental transfer is performed between the first volume and the second volume. In particular, a snapshot of the first volume is created. The snapshot is compared with a prior snapshot that was previously used to perform the last asynchronous transfer (e.g., the baseline transfer or a prior incremental transfer) of data to identify a difference in data of the first volume between the snapshot and the prior snapshot (e.g., changes to the first volume since the last asynchronous transfer). Accordingly, the difference in data is incrementally transferred from the first volume to the second volume. In this way, the second volume will comprise the same data as the first volume as of the point in time when the snapshot was created for performing the incremental transfer. It may be appreciated that other types of replication may be implemented, such as semi-sync replication.

In an embodiment, the first node 130 may store data or a portion thereof within storage hosted by the distributed computing platform 102 by transmitting the data within objects to the distributed computing platform 102. In one example, the first node 130 may locally store frequently accessed data within locally attached storage. Less frequently accessed data may be transmitted to the distributed computing platform 102 for storage within a data storage tier 108. The data storage tier 108 may store data within a service data store 120, and may store client specific data within client data stores assigned to such clients such as a client (1) data store 122 used to store data of a client (1) and a client (N) data store 124 used to store data of a client (N). The data stores may be physical storage devices or may be defined as logical storage, such as a virtual volume, LUNs, or other logical organizations of data that can be defined across one or more physical storage devices. In another example, the first node 130 transmits and stores all client data to the distributed computing platform 102. In yet another example, the client device 128 transmits and stores the data directly to the distributed computing platform 102 without the use of the first node 130.

The management of storage and access to data can be performed by one or more storage virtual machines (SVMs) or other storage applications that provide software as a service (SaaS) such as storage software services. In one example, an SVM may be hosted within the client device 128, within the first node 130, or within the distributed computing platform 102 such as by the application server tier 106. In another example, one or more SVMs may be hosted across one or more of the client device 128, the first node 130, and the distributed computing platform 102. The one or more SVMs may host instances of the storage operating system.

In an example, the storage operating system may be implemented for the distributed computing platform 102. The storage operating system may allow client devices to access data stored within the distributed computing platform 102 using various types of protocols, such as a Network File System (NFS) protocol, a Server Message Block (SMB) protocol and Common Internet File System (CIFS), and Internet Small Computer Systems Interface (iSCSI), and/or other protocols. The storage operating system may provide various storage services, such as disaster recovery (e.g., the ability to non-disruptively transition client devices from accessing a primary node that has failed to a secondary node that is taking over for the failed primary node), backup and archive function, replication such as asynchronous and/or synchronous replication, deduplication, compression, high availability storage, cloning functionality (e.g., the ability to clone a volume, such as a space efficient flex clone), snapshot functionality (e.g., the ability to create snapshots and restore data from snapshots), data tiering (e.g., migrating infrequently accessed data to slower/cheaper storage), encryption, managing storage across various platforms such as between on-premise storage systems and multiple cloud systems, etc.

In one example of the distributed computing platform 102, one or more SVMs may be hosted by the application server tier 106. For example, a server (1) 116 is configured to host SVMs used to execute applications such as storage applications that manage the storage of data of the client (1) within the client (1) data store 122. Thus, an SVM executing on the server (1) 116 may receive data and/or operations from the client device 128 and/or the first node 130 over the network 126. The SVM executes a storage application and/or an instance of the storage operating system to process the operations and/or store the data within the client (1) data store 122. The SVM may transmit a response back to the client device 128 and/or the first node 130 over the network 126, such as a success message or an error message. In this way, the application server tier 106 may host SVMs, services, and/or other storage applications using the server (1) 116, the server (N) 118, etc.

A user interface tier 104 of the distributed computing platform 102 may provide the client device 128 and/or the first node 130 with access to user interfaces associated with the storage and access of data and/or other services provided by the distributed computing platform 102. In an example, a service user interface 110 may be accessible from the distributed computing platform 102 for accessing services subscribed to by clients and/or nodes, such as data replication services, application hosting services, data security services, human resource services, warehouse tracking services, accounting services, etc. For example, client user interfaces may be provided to corresponding clients, such as a client (1) user interface 112, a client (N) user interface 114, etc. The client (1) can access various services and resources subscribed to by the client (1) through the client (1) user interface 112, such as access to a web service, a development environment, a human resource application, a warehouse tracking application, and/or other services and resources provided by the application server tier 106, which may use data stored within the data storage tier 108.

The client device 128 and/or the first node 130 may subscribe to certain types and amounts of services and resources provided by the distributed computing platform 102. For example, the client device 128 may establish a subscription to have access to three virtual machines, a certain amount of storage, a certain type/amount of data redundancy, a certain type/amount of data security, certain service level agreements (SLAs) and service level objectives (SLOs), latency guarantees, bandwidth guarantees, access to execute or host certain applications, etc. Similarly, the first node 130 can establish a subscription to have access to certain services and resources of the distributed computing platform 102.

As shown, a variety of clients, such as the client device 128 and the first node 130, incorporating and/or incorporated into a variety of computing devices may communicate with the distributed computing platform 102 through one or more networks, such as the network 126. For example, a client may incorporate and/or be incorporated into a client application (e.g., software) implemented at least in part by one or more of the computing devices.

Examples of suitable computing devices include personal computers, server computers, desktop computers, nodes, storage servers, nodes, laptop computers, notebook computers, tablet computers or personal digital assistants (PDAs), smart phones, cell phones, and consumer electronic devices incorporating one or more computing device components, such as one or more electronic processors, microprocessors, central processing units (CPU), or controllers. Examples of suitable networks include networks utilizing wired and/or wireless communication technologies and networks operating in accordance with any suitable networking and/or communication protocol (e.g., the Internet). In use cases involving the delivery of customer support services, the computing devices noted represent the endpoint of the customer support delivery process, i.e., the consumer's device.

The distributed computing platform 102, such as a multi-tenant business data processing platform or cloud computing environment, may include multiple processing tiers, including the user interface tier 104, the application server tier 106, and a data storage tier 108. The user interface tier 104 may maintain multiple user interfaces, including graphical user interfaces and/or web-based interfaces. The user interfaces may include the service user interface 110 for a service to provide access to applications and data for a client (e.g., a "tenant") of the service, as well as one or more user interfaces that have been specialized/customized in accordance with user specific requirements (e.g., as discussed above), which may be accessed via one or more APIs.

The service user interface 110 may include components enabling a tenant to administer the tenant's participation in the functions and capabilities provided by the distributed computing platform 102, such as accessing data, causing execution of specific data processing operations, etc. Each processing tier may be implemented with a set of computers, virtualized computing environments such as a storage virtual machine or storage virtual server, and/or computer components including computer servers and processors, and may perform various functions, methods, processes, or operations as determined by the execution of a software application or set of instructions.

The data storage tier 108 may include one or more data stores, which may include the service data store 120 and one or more client data stores 122-124. Each client data store may contain tenant-specific data that is used as part of providing a range of tenant-specific business and storage services or functions, including but not limited to ERP, CRM, eCommerce, Human Resources management, payroll, storage services, etc. Data stores may be implemented with any suitable data storage technology, including structured query language (SQL) based relational database management systems (RDBMS), file systems hosted by operating systems, object storage, etc.

The distributed computing platform 102 may be a multi-tenant and service platform operated by an entity in order to provide multiple tenants with a set of business related applications, data storage, and functionality. These applications and functionality may include ones that a business uses to manage various aspects of its operations. For example, the applications and functionality may include providing web-based access to business information systems, thereby allowing a user with a browser and an Internet or intranet connection to view, enter, process, or modify certain types of business information or any other type of information.

Figure 2:
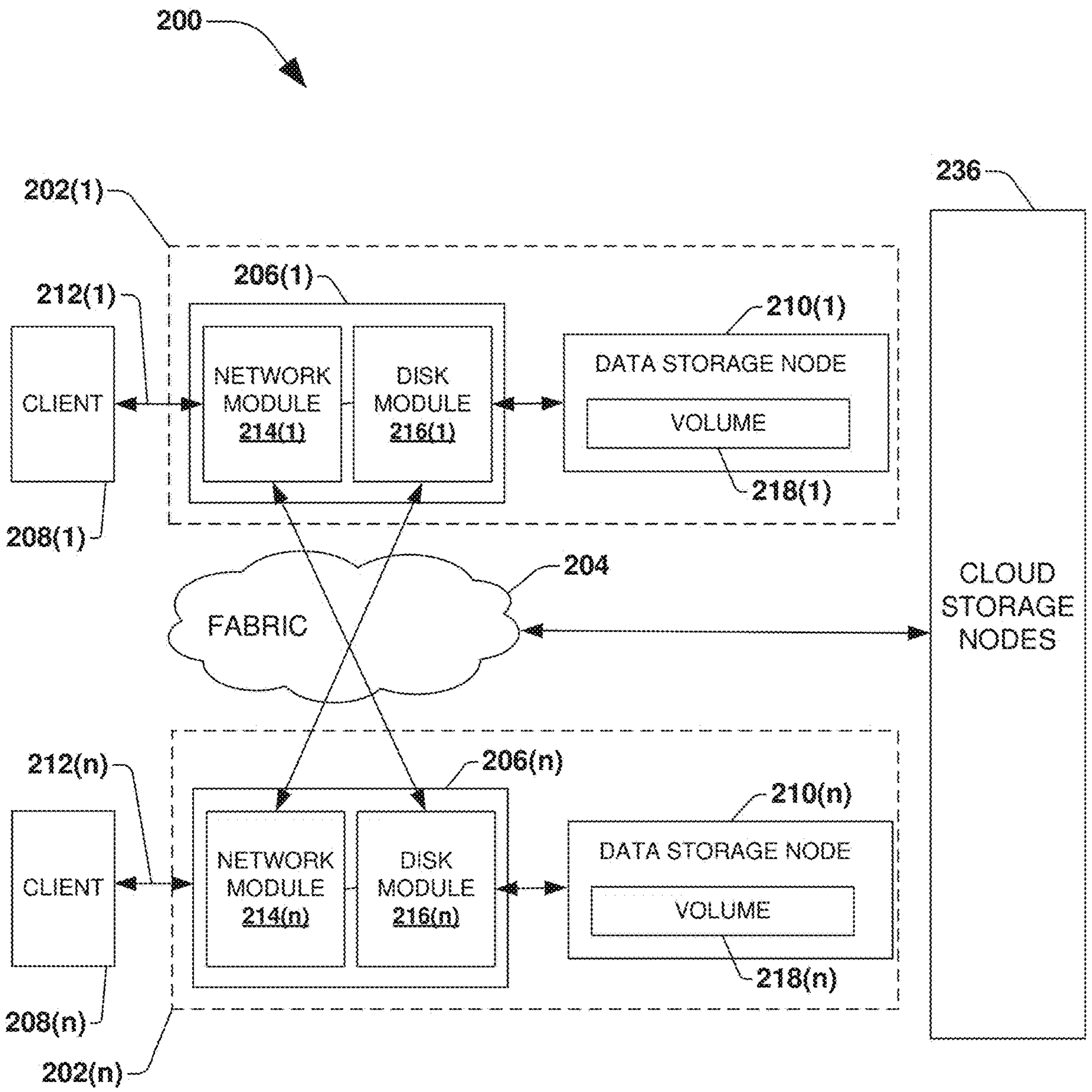
FIG. 2 is a block diagram illustrating a network environment with exemplary node computing devices.

A clustered network environment 200 that may implement one or more aspects of the techniques described and illustrated herein is shown in FIG. 2. The clustered network environment 200 includes data storage apparatuses 202(1)-202(*n*) that are coupled over a cluster or cluster fabric 204 that includes one or more communication network(s) and facilitates communication between the data storage apparatuses 202(1)-202(*n*) (and one or more modules, components, etc. therein, such as, node computing devices 206(1)-206(*n*), for example), although any number of other elements or components can also be included in the clustered network environment 200 in other examples. This technology provides a number of advantages including methods, non-transitory computer readable media, and computing devices that implement the techniques described herein.

In this example, node computing devices 206(1)-206(*n*) can be primary or local storage controllers or secondary or remote storage controllers that provide client devices 208(1)-208(*n*) with access to data stored within data storage devices 210(1)-210(*n*) and cloud storage device(s) 236 (also referred to as cloud storage node(s)). The node computing devices 206(1)-206(*n*) may be implemented as hardware, software (e.g., a storage virtual machine), or combination thereof.

The data storage apparatuses 202(1)-202(*n*) and/or node computing devices 206(1)-206(*n*) of the examples described and illustrated herein are not limited to any particular geographic areas and can be clustered locally and/or remotely via a cloud network, or not clustered in other examples. Thus, in one example the data storage apparatuses 202(1)-202(*n*) and/or node computing device 206(1)-206(*n*) can be distributed over a plurality of storage systems located in a plurality of geographic locations (e.g., located on-premise, located within a cloud computing environment, etc.); while in another example a clustered network can include data storage apparatuses 202(1)-202(*n*) and/or node computing device 206(1)-206(*n*) residing in a same geographic location (e.g., in a single on-site rack).

In the illustrated example, one or more of the client devices 208(1)-208(*n*), which may be, for example, personal computers (PCs), computing devices used for storage (e.g., storage servers), or other computers or peripheral devices, are coupled to the respective data storage apparatuses 202(1)-202(*n*) by network connections 212(1)-212(*n*). Network connections 212(1)-212(*n*) may include a local area network (LAN) or wide area network (WAN) (i.e., a cloud network), for example, that utilize TCP/IP and/or one or more Network Attached Storage (NAS) protocols, such as a Common Internet Filesystem (CIFS) protocol or a Network Filesystem (NFS) protocol to exchange data packets, a Storage Area Network (SAN) protocol, such as Small Computer System Interface (SCSI) or Fiber Channel Protocol (FCP), an object protocol, such as simple storage service (S3), and/or non-volatile memory express (NVMe), for example.

Illustratively, the client devices 208(1)-208(*n*) may be general-purpose computers running applications and may interact with the data storage apparatuses 202(1)-202(*n*) using a client/server model for exchange of information. That is, the client devices 208(1)-208(*n*) may request data from the data storage apparatuses 202(1)-202(*n*) (e.g., data on one of the data storage devices 210(1)-210(*n*) managed by a network storage controller configured to process I/O commands issued by the client devices 208(1)-208(*n*)), and the data storage apparatuses 202(1)-202(*n*) may return results of the request to the client devices 208(1)-208(*n*) via the network connections 212(1)-212(*n*).

The node computing devices **206(1)-206(*n*) of the data storage apparatuses 202(1)-202(*n*) can include network or host nodes that are interconnected as a cluster to provide data storage and management services, such as to an enterprise having remote locations, cloud storage (e.g., a storage endpoint may be stored within cloud storage device(s) 236), etc., for example. Such node computing devices 206(1)-206(*n*) can be attached to the cluster fabric 204 at a connection point, redistribution point, or communication endpoint, for example. One or more of the node computing devices 206(1)-206(*n*)** may be capable of sending, receiving, and/or forwarding information over a network communications channel, and could comprise any type of device that meets any or all of these criteria.

In an example, the node computing devices 206(1) and **206(*n*) may be configured according to a disaster recovery configuration whereby a surviving node provides switchover access to the storage devices 210(1)-210(*n*) in the event a disaster occurs at a disaster storage site (e.g., the node computing device 206(1) provides client device 212(*n*) with switchover data access to data storage devices 210(*n*) in the event a disaster occurs at the second storage site). In other examples, the node computing device 206(*n*) can be configured according to an archival configuration and/or the node computing devices 206(1)-206(*n*) can be configured based on another type of replication arrangement (e.g., to facilitate load sharing). Additionally, while two node computing devices are illustrated in FIG. 2**, any number of node computing devices or data storage apparatuses can be included in other examples in other types of configurations or arrangements.

As illustrated in the clustered network environment 200, node computing devices **206(1)-206(*n*) can include various functional components that coordinate to provide a distributed storage architecture. For example, the node computing devices 206(1)-206(*n*) can include network modules 214(1)-214(*n*) and disk modules 216(1)-216(*n*). Network modules 214(1)-214(*n*) can be configured to allow the node computing devices 206(1)-206(*n*) (e.g., network storage controllers) to connect with client devices 208(1)-208(*n*) over the storage network connections 212(1)-212(*n*), for example, allowing the client devices 208(1)-208(*n*) to access data stored in the clustered network environment 200**.

Further, the network modules **214(1)-214(*n*) can provide connections with one or more other components through the cluster fabric 204. For example, the network module 214(1) of node computing device 206(1) can access the data storage device 210(*n*) by sending a request via the cluster fabric 204 through the disk module 216(*n*) of node computing device 206(*n*) when the node computing device 206(*n*) is available. Alternatively, when the node computing device 206(*n*) fails, the network module 214(1) of node computing device 206(1) can access the data storage device 210(*n*) directly via the cluster fabric 204. The cluster fabric 204** can include one or more local and/or wide area computing networks (i.e., cloud networks) embodied as Infiniband, Fibre Channel (FC), or Ethernet networks, for example, although other types of networks supporting other protocols can also be used.

Disk modules **216(1)-216(*n*) can be configured to connect data storage devices 210(1)-210(*n*), such as disks or arrays of disks, SSDs, flash memory, or some other form of data storage, to the node computing devices 206(1)-206(*n*). Often, disk modules 216(1)-216(*n*) communicate with the data storage devices 210(1)-210(*n*) according to the SAN protocol, such as SCSI or FCP, for example, although other protocols can also be used. Thus, as seen from an operating system on node computing devices 206(1)-206(*n*), the data storage devices 210(1)-210(*n*) can appear as locally attached. In this manner, different node computing devices 206(1)-206(*n*)**, etc. may access data blocks, files, or objects through the operating system, rather than expressly requesting abstract files.

While the clustered network environment 200 illustrates an equal number of network modules **214(1)-214(*n*) and disk modules 216(1)-216(*n*)**, other examples may include a differing number of these modules. For example, there may be a plurality of network and disk modules interconnected in a cluster that do not have a one-to-one correspondence between the network and disk modules. That is, different node computing devices can have a different number of network and disk modules, and the same node computing device can have a different number of network modules than disk modules.

Further, one or more of the client devices **208(1)-208(*n*) can be networked with the node computing devices 206(1)-206(*n*) in the cluster, over the storage connections 212(1)-212(*n*). As an example, respective client devices 208(1)-208(*n*) that are networked to a cluster may request services (e.g., exchanging of information in the form of data packets) of node computing devices 206(1)-206(*n*) in the cluster, and the node computing devices 206(1)-206(*n*) can return results of the requested services to the client devices 208(1)-208(*n*). In one example, the client devices 208(1)-208(*n*) can exchange information with the network modules 214(1)-214(*n*) residing in the node computing devices 206(1)-206(*n*) (e.g., network hosts) in the data storage apparatuses 202(1)-202(*n*)**.

In one example, the storage apparatuses **202(1)-202(*n*) host aggregates corresponding to physical local and remote data storage devices, such as local flash or disk storage in the data storage devices 210(1)-210(*n*), for example. One or more of the data storage devices 210(1)-210(*n*)** can include mass storage devices, such as disks of a disk array. The disks may comprise any type of mass storage devices, including but not limited to magnetic disk drives, flash memory, and any other similar media adapted to store information, including, for example, data and/or parity information.

The aggregates include volumes **218(1)-218(*n*) in this example, although any number of volumes can be included in the aggregates. The volumes 218(1)-218(*n*) are virtual data stores or storage objects that define an arrangement of storage and one or more filesystems within the clustered network environment 200. Volumes 218(1)-218(*n*) can span a portion of a disk or other storage device, a collection of disks, or portions of disks, for example, and typically define an overall logical arrangement of data storage. In one example volumes 218(1)-218(*n*) can include stored user data as one or more files, blocks, or objects that may reside in a hierarchical directory structure within the volumes 218(1)-218(*n*)**.

Volumes **218(1)-218(*n*) are typically configured in formats that may be associated with particular storage systems, and respective volume formats typically comprise features that provide functionality to the volumes 218(1)-218(*n*), such as providing the ability for volumes 218(1)-218(*n*) to form clusters, among other functionality. Optionally, one or more of the volumes 218(1)-218(*n*) can be in composite aggregates and can extend between one or more of the data storage devices 210(1)-210(*n*) and one or more of the cloud storage device(s) 236** to provide tiered storage, for example, and other arrangements can also be used in other examples.

In one example, to facilitate access to data stored on the disks or other structures of the data storage devices 210(1)-

210(*n*), a filesystem may be implemented that logically organizes the information as a hierarchical structure of directories and files. In this example, respective files may be implemented as a set of disk blocks of a particular size that are configured to store information, whereas directories may be implemented as specially formatted files in which information about other files and directories are stored.

Data can be stored as files or objects within a physical volume and/or a virtual volume, which can be associated with respective volume identifiers. The physical volumes correspond to at least a portion of physical storage devices, such as the data storage devices 210(1)-210(*n*) (e.g., a Redundant Array of Independent (or Inexpensive) Disks (RAID system)) whose address, addressable space, location, etc. does not change. Typically the location of the physical volumes does not change in that the range of addresses used to access it generally remains constant.

Virtual volumes, in contrast, can be stored over an aggregate of disparate portions of different physical storage devices. Virtual volumes may be a collection of different available portions of different physical storage device locations, such as some available space from disks, for example. It will be appreciated that since the virtual volumes are not "tied" to any one particular storage device, virtual volumes can be said to include a layer of abstraction or virtualization, which allows it to be resized and/or flexible in some regards.

Further, virtual volumes can include one or more logical unit numbers (LUNs), directories, Qtrees, files, and/or other storage objects, for example. Among other things, these features, but more particularly the LUNs, allow the disparate memory locations within which data is stored to be identified, for example, and grouped as data storage unit. As such, the LUNs may be characterized as constituting a virtual disk or drive upon which data within the virtual volumes is stored within an aggregate. For example, LUNs are often referred to as virtual drives, such that they emulate a hard drive, while they actually comprise data blocks stored in various parts of a volume.

In one example, the data storage devices 210(1)-210(*n*) can have one or more physical ports, wherein each physical port can be assigned a target address (e.g., SCSI target address). To represent respective volumes, a target address on the data storage devices 210(1)-210(*n*) can be used to identify one or more of the LUNs. Thus, for example, when one of the node computing devices 206(1)-206(*n*) connects to a volume, a connection between the one of the node computing devices 206(1)-206(*n*) and one or more of the LUNs underlying the volume is created.

Respective target addresses can identify multiple of the LUNs, such that a target address can represent multiple volumes. The I/O interface, which can be implemented as circuitry and/or software in a storage adapter or as executable code residing in memory and executed by a processor, for example, can connect to volumes by using one or more addresses that identify the one or more of the LUNs.

Figure 3:
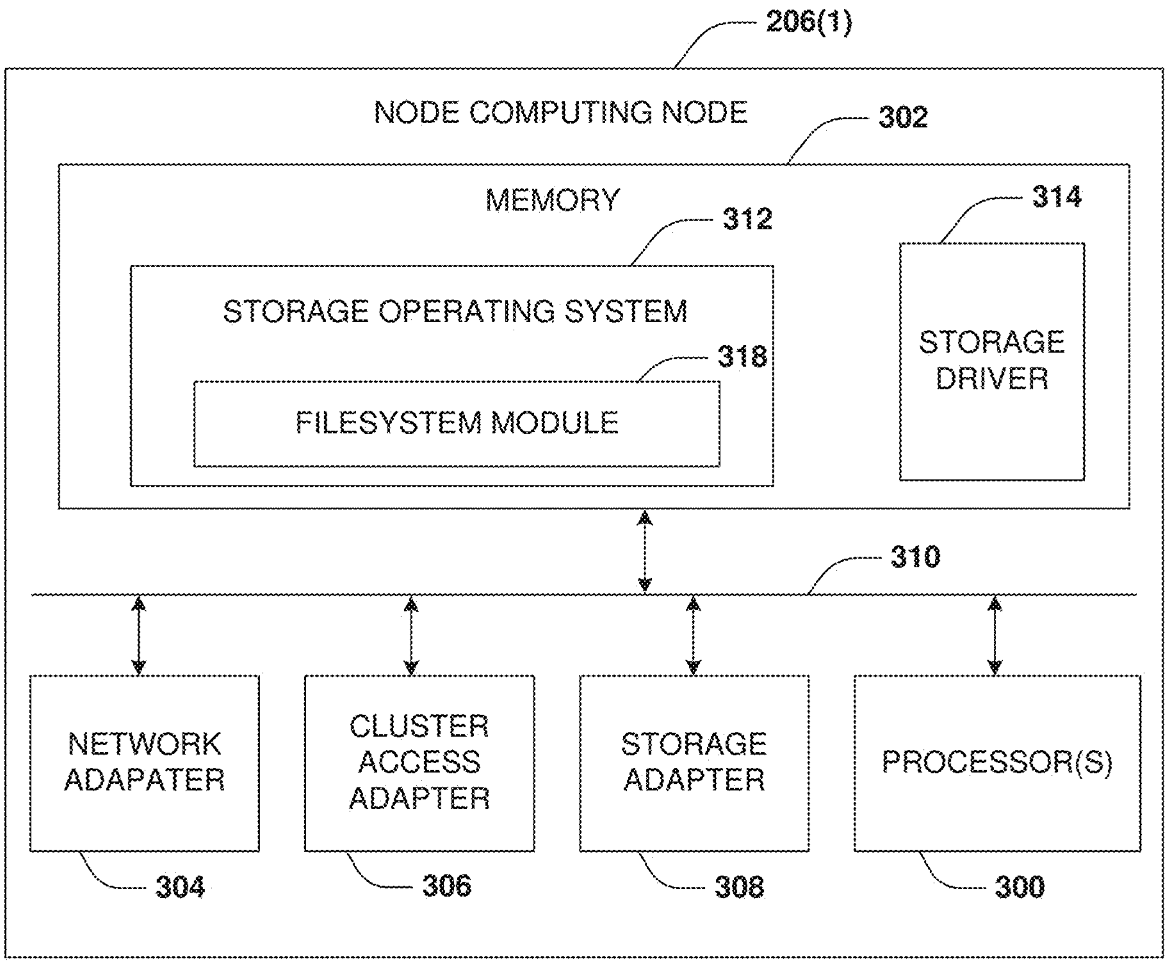
FIG. 3 is a block diagram illustrating an exemplary node computing device.

Referring to FIG. 3, node computing device 206(1) in this particular example includes processor(s) 300, a memory 302, a network adapter 304, a cluster access adapter 306, and a storage adapter 308 interconnected by a system bus 310. In other examples, the node computing device 206(1) comprises a virtual machine, such as a virtual storage machine. The node computing device 206(1) also includes a storage operating system 312 installed in the memory 302 that can, for example, implement a RAID data loss protection and recovery scheme to optimize reconstruction of data of a failed disk or drive in an array, along with other functionality such as deduplication, compression, snapshot creation, data mirroring, synchronous replication, asynchronous replication, encryption, etc. In some examples, the node computing device 206(*n*) is substantially the same in structure and/or operation as node computing device 206(1), although the node computing device 206(*n*) can also include a different structure and/or operation in one or more aspects than the node computing device 206(1).

The network adapter 304 in this example includes the mechanical, electrical and signaling circuitry needed to connect the node computing device 206(1) to one or more of the client devices 208(1)-208(*n*) over network connections 212(1)-212(*n*), which may comprise, among other things, a point-to-point connection or a shared medium, such as a local area network. In some examples, the network adapter 304 further communicates (e.g., using TCP/IP) via the cluster fabric 204 and/or another network (e.g. a WAN) (not shown) with cloud storage device(s) 236 to process storage operations associated with data stored thereon.

The storage adapter 308 cooperates with the storage operating system 312 executing on the node computing device 206(1) to access information requested by one of the client devices 208(1)-208(*n*) (e.g., to access data on a data storage device 210(1)-210(*n*) managed by a network storage controller). The information may be stored on any type of attached array of writeable media such as magnetic disk drives, flash memory, and/or any other similar media adapted to store information.

In the exemplary data storage devices 210(1)-210(*n*), information can be stored in data blocks on disks. The storage adapter 308 can include I/O interface circuitry that couples to the disks over an I/O interconnect arrangement, such as a storage area network (SAN) protocol (e.g., Small Computer System Interface (SCSI), Internet SCSI (ISCSI), hyperSCSI, Fiber Channel Protocol (FCP)). The information is retrieved by the storage adapter 308 and, if necessary, processed by the processor(s) 300 (or the storage adapter 308 itself) prior to being forwarded over the system bus 310 to the network adapter 304 (and/or the cluster access adapter 306 if sending to another node computing device in the cluster) where the information is formatted into a data packet and returned to a requesting one of the client devices 208(1)-208(*n*) and/or sent to another node computing device attached via the cluster fabric 204. In some examples, a storage driver 314 in the memory 302 interfaces with the storage adapter to facilitate interactions with the data storage devices 210(1)-210(*n*).

The storage operating system 312 can also manage communications for the node computing device 206(1) among other devices that may be in a clustered network, such as attached to a cluster fabric 204. Thus, the node computing device 206(1) can respond to client device requests to manage data on one of the data storage devices 210(1)-210(*n*) or cloud storage device(s) 236 (e.g., or additional clustered devices) in accordance with the client device requests.

The file system module 318 of the storage operating system 312 can establish and manage one or more filesystems including software code and data structures that implement a persistent hierarchical namespace of files and directories, for example. As an example, when a new data storage device (not shown) is added to a clustered network system, the file system module 318 is informed where, in an existing directory tree, new files associated with the new data storage device are to be stored. This is often referred to as "mounting" a filesystem.

In the example node computing device 206(1), memory 302 can include storage locations that are addressable by the processor(s) 300 and adapters 304, 306, and 308 for storing related software application code and data structures. The processor(s) 300 and adapters 304, 306, and 308 may, for example, include processing elements and/or logic circuitry configured to execute the software code and manipulate the data structures.

The storage operating system 312, portions of which are typically resident in the memory 302 and executed by the processor(s) 300, invokes storage operations in support of a file service implemented by the node computing device 206(1). Other processing and memory mechanisms, including various computer readable media, may be used for storing and/or executing application instructions pertaining to the techniques described and illustrated herein. For example, the storage operating system 312 can also utilize one or more control files (not shown) to aid in the provisioning of virtual machines.

In this particular example, the memory 302 also includes a module configured to implement the techniques described herein, including for example implementing a file system format for persistent memory as discussed above and further below.

The examples of the technology described and illustrated herein may be embodied as one or more non-transitory computer or machine readable media, such as the memory 302, having machine or processor-executable instructions stored thereon for one or more aspects of the present technology, which when executed by processor(s), such as processor(s) 300, cause the processor(s) to carry out the steps necessary to implement the methods of this technology, as described and illustrated with the examples herein. In some examples, the executable instructions are configured to perform one or more steps of a method described and illustrated later.

Figure 4:
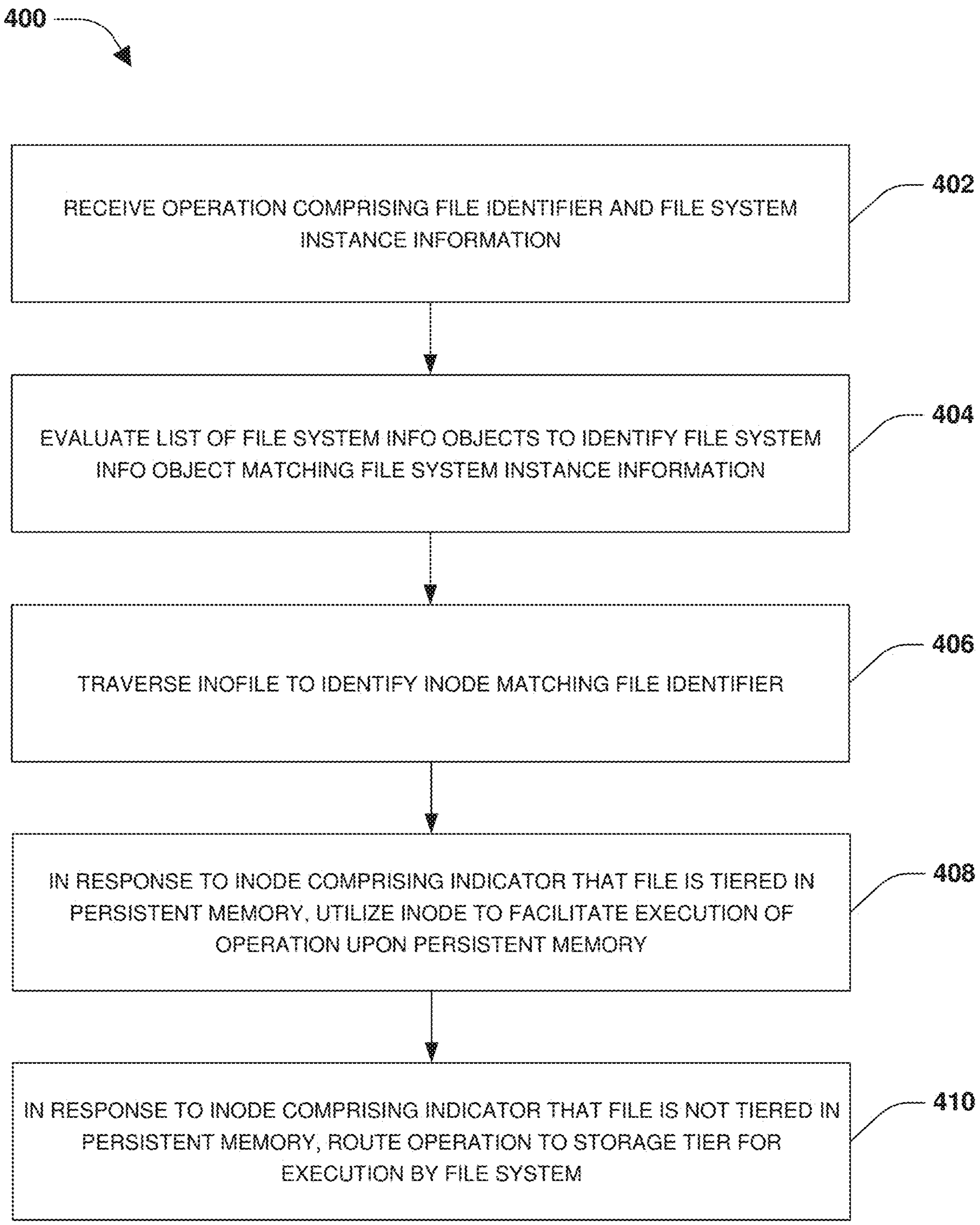
FIG. 4 is a flow chart illustrating an example method for implementing a file system format for persistent memory.
Figure 5:
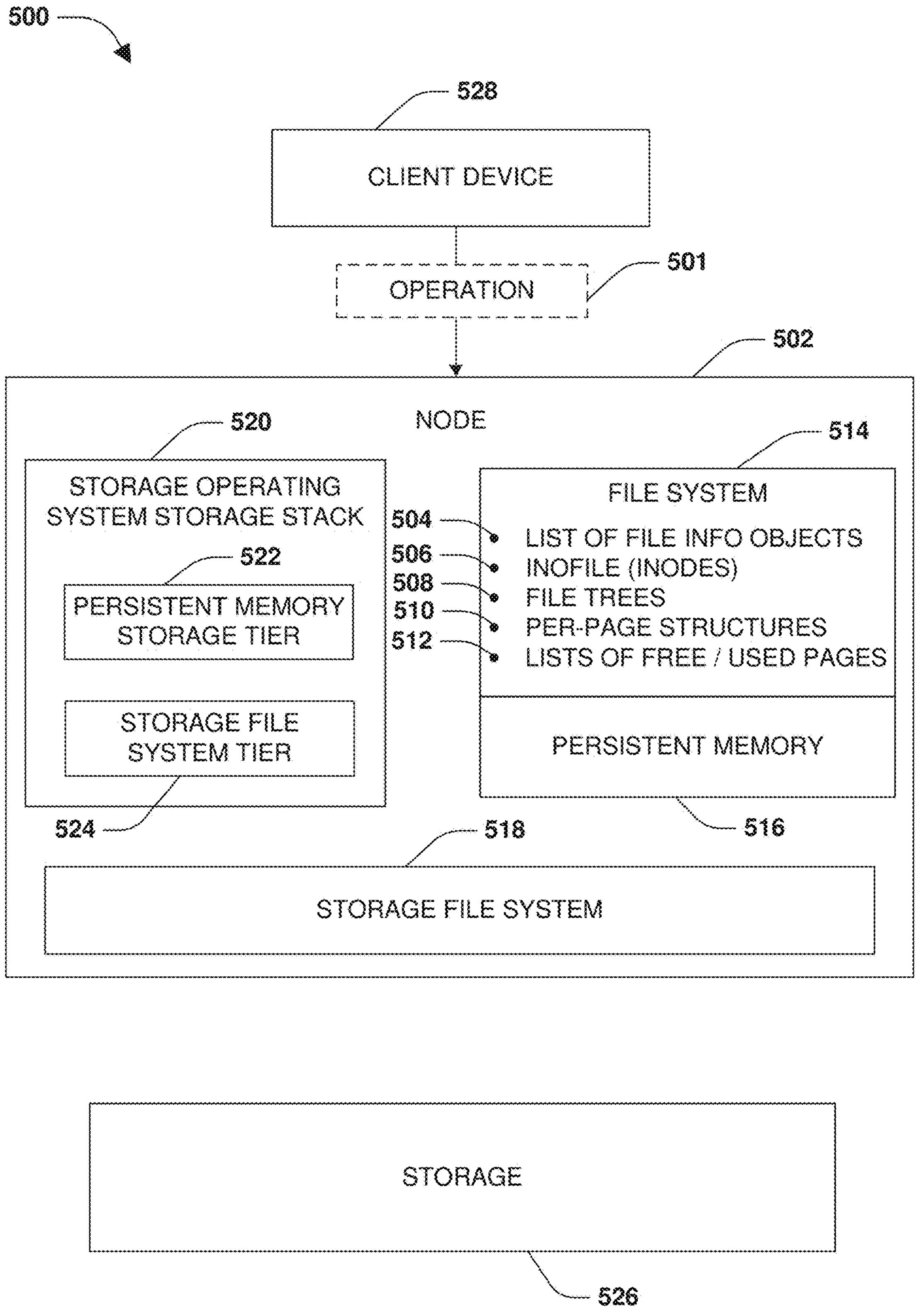
FIG. 5 is a block diagram illustrating an example system for implementing a file system format for persistent memory.

One embodiment of implementing a file system format for persistent memory is illustrated by an exemplary method 400 of FIG. 4, which is further described in conjunction with system 500 of FIG. 5. A node 502 may comprise a server, an on-premise device, a virtual machine, computing resources of a cloud computing environment (e.g., a virtual machine hosted within the cloud), a computing device, hardware, software, or combination thereof. The node 502 may be configured to manage the storage and access of data on behalf of clients, such as a client device 528. The node 502 may host a storage operating system configured to store and manage data within and/or across various types of storage devices, such as locally attached storage, cloud storage, disk storage, flash storage, solid state drives, tape, hard disk drives, etc. For example, the storage operating system of the node 502 may store data within storage 526 composed of one or more types of block-addressable storage (e.g., disk drive, a solid state drive, etc.). The data may be stored within storage objects, such as volumes, logical unit numbers (LUNs), aggregates, cloud storage objects, etc. In an example, an aggregate or other storage object may be comprised of physical storage of a single storage device or storage of multiple storage devices or storage providers.

The storage operating system of the node 502 may implement a storage file system 518 that manages the storage and client access of data within the storage objects stored within the storage 526 associated with the node 502. For example, the client device 528 may utilize the storage file system 518 in order to create, delete, organize, modify, and/or access files within directories of a volume managed by the storage file system 518. The storage operating system may maintain/comprise a storage operating system storage stack 520 that comprises a plurality of levels through which operations, such as read and write operations from client devices, are processed. An operation may first be processed by a highest level tier, and then down through lower level tiers of the storage operating system storage stack 520 until reaching a lowest level tier of the storage operating system storage stack 520. The storage file system 518 may be managed by a storage file system tier 524 within the storage operating system storage stack 520. When an operation reaches the storage file system tier 524, the operation may be processed by the storage file system 518 for storage within the storage 526.

The storage file system 518 may be configured with commands, APIs, data structures (e.g., data structures used to identify block address locations of data the storage 526), and/or other functionality (e.g., functionality to access certain block ranges within the storage 526) that is tailored to the block-addressable storage 526. Because the storage file system 518 is tailored for the block-addressable semantics of the storage 526, the storage file system 518 may be unable to utilize other types of storage that use a different addressing semantics such as persistent memory 516 that is byte-addressable. The persistent memory 516 provides relatively lower latency and faster access speeds than the block-addressable storage 526, such as disk drives and solid state drives, that the storage file system 518 is natively tailored to manage. Because the persistent memory 516 is byte-addressable instead of block-addressable, the storage file system 518, data structures of the storage file system 518 used to locate data according to block-addressable semantics of the storage 526, and the commands to store and retrieved data from the block-addressable storage 526 cannot be leveraged for the byte-addressable persistent memory 516.

Accordingly, as provided herein, a file system 514 and a persistent memory storage tier 522 for managing the file system 514 are implemented so that the node 502 can use the file system 514 to access and manage the persistent memory 516 or other types of non-block-addressable storage such as byte-addressable storage for storing user data. The persistent memory 516 may comprise memory that is persistent, such that data structures can be stored in a manner where the data structures can continue to be accessed using memory instructions and/or memory APIs even after the end of a process that created or last modified the data structures. The data structures and data will persist even in the event of a power loss, failure and reboot, etc. The persistent memory 516 is non-volatile memory that has nearly the same speed and latency of DRAM and has the non-volatility of NAND flash. The persistent memory 516 could dramatically increase system performance of the node 502 compared to the higher latency and slower speeds of the block-addressable storage 526 accessible to the node 502 through the storage file system 518 using the storage file system tier 524 (e.g., hard disk drives, solid state storage, cloud storage, etc.). The persistent memory 516 is byte-addressable, and may be accessed through a memory controller. This provides faster and more fine-grained access to persistent storage within the persistent memory 516 compared to block-based access to the block-addressable storage 526 through the storage file system 518.

The file system 514 implemented for the byte-addressable persistent memory 516 is different than the storage file system 518 implemented for the block-addressable storage 526. For example, the file system 514 may comprise data structures and/or functionality tailored to byte-addressable semantics of the persistent memory 516 for accessing bytes of storage, which are different than data structures and functionality of the storage file system 518 that are tailored to block-addressable semantics of the storage 526 for accessing blocks of storage. Furthermore, the file system 514 is tailored for the relatively faster access speeds and lower latency of the persistent memory 516, which improves the operation of the node 502 by allowing the node 502 to process I/O from client devices much faster using the persistent memory storage tier 522, the file system 514, and the persistent memory 516.

In order to integrate the persistent memory 516 into the node 502 in a manner that allows client data of client devices, such as the client device 528, to be stored into and read from the persistent memory 516, the persistent memory storage tier 522 is implemented within the storage operating system storage stack 520 for managing the persistent memory 516. The persistent memory storage tier 522 is maintained at a higher level within the storage operating system storage stack 520 than the storage file system tier 524 used to manage the storage file system 518. The persistent memory storage tier 522 is maintained higher in the storage operating system storage stack 520 than the storage file system tier 524 so that operations received from client devices by the node 502 are processed by the persistent memory storage tier 522 before the storage file system tier 524 even though the operations may target the storage file system 518 managed by the storage file system tier 524. This occurs because higher levels within the storage operation system storage stack 520 process operations before lower levels within the storage operation system storage stack 520.

The persistent memory storage tier 522 may implement various APIs, functionality, data structures, and commands for the file system 514 to access and/or manage the persistent memory 516. For example, the persistent memory storage tier 522 may implement APIs to access the file system 514 of the persistent memory 516 for storing data into and/or retrieving data from the persistent memory 516 according to byte-addressable semantics of the persistent memory 516. The persistent memory storage tier 522 may implement functionality to determine when data should be tiered out from the persistent memory 516 to the storage 526 based upon the data becoming infrequently accessed, and thus cold (e.g., the functionality may track how often and how recent data within the persistent memory 516 has been accessed).

The file system 514 is configured with data structures for tracking and locating data within the persistent memory 516 according to the byte-addressable semantics. For example, the file system 514 indexes the persistent memory 516 of the node 502 as an array of pages (e.g., 4 kb pages) indexed by page block numbers. Page (0) may be left unused in the event another data structure such as an indirect page references the page (0), then the reference can be determined to be an accident. Page (1) comprises a file system superblock that is a root of a file system tree of the file system 514. A duplicate copy of the file system superblock may be maintained within another page of the persistent memory 516 (e.g., a last page, a second to last page, a page that is a threshold number of indexed pages away from page (1), etc.). The file system superblock comprises a location of a list of file system info objects 504.

The list of file system info objects 504 comprises a linked list of pages, where each page contains a set of file system info objects. If there are more file system info objects than what can be stored within a page, then additional pages may be used to store the remaining file system info objects and each page will have a location of the next page of file system info objects. In this way, a plurality of file system info objects can be stored within a page of the persistent memory 516. Each file system info object defines a file system instance for a volume and snapshot (e.g., a first file system info object correspond to an active file system of the volume, a second file system info object may correspond to a first snapshot of the volume, a third file system info object may correspond to a second snapshot of the volume, etc.). Each file system info object comprises a location within the persistent memory 516 of an inofile (e.g., a root of a page tree of the inofile) comprising inodes of a file system instance.

An inofile 506 of the file system instance comprises an inode for each file within the file system instance. An inode of a file comprises metadata about the file. Each inode stores a location of a root of a file tree for a given file. In particular, the file system 514 maintains file trees 508, where each file is represented by a file tree of indirect pages (intermediate nodes of the file tree) and direct blocks (leaf nodes of the file tree). The direct blocks are located in a bottom level of the file tree, and one or more levels of indirect pages are located above the bottom level of the file tree. The indirect pages of a particular level comprise references to blocks in a next level down within the file tree (e.g., a reference comprising a file block number of a next level down node or a reference comprising a per-page structure ID of a per-page structure having the file block number of the next level down node). Direct blocks are located at a lowest level in the file tree and comprise user data. Thus, a file tree for a file may be traversed by the file system 514 using a byte range (e.g., a byte range specified by an I/O operation) mapped to a page index of a page (e.g., a 4 k offset) comprising the data within the file to be accessed.

The file system 514 may maintain other data structures used to track and locate data within the persistent memory 516. In an embodiment, the file system maintains per-page structures 510, which will be further described with respect to method 700 of FIG. 7 and system 800 of FIG. 8. A per-page structure 510 is used to track metadata about each page within the persistent memory 516. Each page will correspond to a single per-page structure that comprises metadata about the page. In an embodiment, the per-page structures 510 are stored in an array within the persistent memory 516. The per-page structures 510 correspond to file system superblock pages, file system info pages, indirect pages of the inofile 506, user data pages within the file trees 508, per-page structure array pages, etc.

In an embodiment of implementing per-page structure to page mappings using a one-to-one mapping, a per-page structure for a page can be fixed at a page block number offset within a per-page structure table. In an embodiment of implementing per-page structure to page mappings using a variable mapping, a per-page structure of a page stores a page block number of the page represented by the per-page structure. With the variable mapping, persistent memory objects, such as those stored within the file system superblock to point to the list of file system info objects 504, within a file system info object to point to the root of the inofile 506, within an inode to point to a root of a file tree of a file, and within indirect pages to point to child blocks within the file tree, will store a per-page structure ID of its per-page structure as a location of a child page being pointed to, and will redirect through the per-page structure using the per-page structure ID to identify the physical block number of the child page being pointed to. Thus, an indirect entry of an indirect page will comprise a per-page structure ID that can be used to identify a per-page structure having a physical block number of the child page pointed to by the indirect page.

In an embodiment, the file system 514 may maintain lists of free and in-use pages 512. For example, the file system 514 may maintain a first list of in-use pages of the persistent memory 516 that are storing data (e.g., pages having a dirty state or a reach cached state). The file system 514 may maintain a second list of free pages of the persistent memory 516 that are not currently storing data (e.g., pages have a free state). If the node 502 crashes or reboots, then the information within the lists of free and in-use pages 512 are cleared/zeroed, and are reset/repopulated with refresh data during reboot of the node 502 based upon page states, of pages, maintained within the per-page structures 510.

The persistent memory storage tier 522 may implement functionality to utilize a policy to determine whether certain operations should be redirected to the file system 514 and the persistent memory 516 or to the storage file system 518 and the storage 526 (e.g., if a write operation targets a file that the policy predicts will be accessed again, such as accessed within a threshold timespan or accessed above a certain frequency, then the write operation will be retargeted to the persistent memory 516). For example, the node 502 may receive an operation from the client device 528. The operation may be processed by the storage operating system using the storage operating system storage stack 520 from a highest level down through lower levels of the storage operating system storage stack 520. Because the persistent memory storage tier 522 is at a higher level within the storage operating system storage stack 520 than the storage file system tier 524, the operation is intercepted by the persistent memory storage tier 522 before reaching the storage file system tier 524. The operation is intercepted by the persistent memory storage tier 522 before reaching the storage file system tier 524 even though the operation may target the storage file system 518 managed by the storage file system tier 524. This is because the persistent memory storage tier 522 is higher in the storage operating system storage stack 520 than the storage file system tier 524, and operations are processed by higher levels before lower levels within the storage operating system storage stack 520.

Accordingly, the operation is intercepted by the persistent memory storage tier 522 within the storage operating system storage stack 520. The persistent memory storage tier 522 may determine whether the operation is to be retargeted to the file system 514 and the persistent memory 516 or whether the operation is to be transmitted (e.g., released to lower tiers within the storage operating system storage stack 520) by the persistent memory storage tier 522 to the storage file system tier 524 for processing by the storage file system 518 utilizing the storage 526. In this way, the tiers within the storage operating system storage stack 520 are used to determine how to route and process operations utilizing the persistent memory 516 and/or the storage 526.

In an embodiment of processing operations, an operation 501 is received by the node 502, at 402 (of FIG. 4's exemplary method 400). The operation 501 may comprise a file identifier of a file to be accessed. The operation 501 may comprise file system instance information, such as a volume identifier of a volume to be accessed and/or a snapshot identifier of a snapshot of the volume to be accessed. If an active file system of the volume is to be accessed, then the snapshot identifier may be empty, null, missing, comprising a zero value, or otherwise comprising an indicator that no snapshot is to be accessed. The operation 501 may comprise a byte range of the file to be accessed.

At 404, the list of file system info objects 504 is evaluated using the file system information to identify a file system info object matching the file system instance information. That is, the file system info object may correspond to an instance of the volume (e.g., the active file system of the volume or a snapshot identified by the snapshot identifier of the volume identified by the volume identifier within the operation 501) being targeted by the operation 501, which is referred to as an instance of a file system or a file system instance. In an example of the list of file system info objects 504, the list of file system info objects 504 is maintained as a linked list of entries. Each entry corresponds to a file system info object, and comprises a volume identifier and a snapshot identifier of the file system info object. In response to the list of file system info objects 504 not comprising any file system info objects that match the file system instance information, the operation 501 is routed to the storage file system tier 524 for execution by the storage file system 518 upon the block-addressable storage 526 because the file system instance is not tiered into the persistent memory 516. However, if the file system info object matching the file system instance information is found, then the file system info object is evaluated to identify an inofile such as the inofile 506 as comprising inodes representing files of the file system instance targeted by the operation 501.

At 406, the inofile 506 is traversed to identify an inode matching the file identifier specified by the operation 501. The inofile 506 may be represented as a page tree having levels of indirect pages (intermediate nodes of the page tree) pointing to blocks within lower levels (e.g., a root points to level 2 indirect pages, the level 2 indirect pages point to level 1 indirect pages, and the level 1 indirect pages point to level 0 direct blocks). The page tree has a bottom level (level 0) of direct blocks (leaf nodes of the page tree) corresponding to the inodes of the file. In this way, the indirect pages within the inofile 506 are traversed down until a direct block corresponding to an inode having the file identifier of the file targeted by the operation 501 is located.

At 408, the inode may be utilized by the file system 514 to facilitate execution of the operation 501 by the persistent memory storage tier 522 upon the persistent memory 516 in response to the inode comprising an indicator (e.g., a flag, a bit, etc.) specifying that the file is tiered into the persistent memory 516 of the node 502. At 410, if the indicator specifies that the file is not tiered into the persistent memory 516 of the node 502, then the operation 501 is routed to the storage file system tier 524 for execution by the storage file system 518 upon the block-addressable storage 526.

In an example where the operation 501 is a read operation and the inode comprises an indicator that the file is tiered into the persistent memory 516, the inode is evaluated to identify a pointer to a file tree of the file. The file tree may comprise indirect pages (intermediate nodes of the file tree comprising references to lower nodes within the file tree) and direct blocks (leaf nodes of the file tree comprising user data of the file). The file tree may be traversed down through levels of the indirect pages to a bottom level of direct blocks in order to locate one or more direct blocks corresponding to pages within the persistent memory 516 comprising data to be read by the read operation (e.g., a direct block corresponding to the byte range specified by the operation 501). That is, the file tree may be traversed to identify data within one or more pages of the persistent memory 516 targeted by the read operation. The traversal utilizes the byte range specified by the read operation. The byte range is mapped to a page index of a page (e.g., a 4 kb offset) of the data within the file to be accessed by the read operation. In an example, the file tree is traversed to determine whether the byte range is present within the persistent memory 516. If the byte range is present, then the read operation is executed upon the byte range. If the byte range is not present, then the read operation is routed to the storage file system tier 524 for execution by the storage file system 518 upon the block-based storage 526 because the byte range to be read is not stored within the persistent memory 516.

In an example where the operation 501 is a write operation, access pattern history of the file (e.g., how frequently and recently the file has been accessed) is evaluated in order to determine whether to execute the write operation upon the persistent memory 516 or to route the write operation to the storage file system tier 524 for execution by the storage file system 518 upon the block-addressable storage 526. In this way, operations are selectively redirected by the persistent memory storage tier 522 to the file system 514 for execution upon the byte-addressable persistent memory 516 or routed to the storage file system tier 524 for execution by the storage file system 518 upon the block-addressable storage 526 based upon the access pattern history (e.g., write operations targeting more frequently or recently accessed data/files may be executed against the persistent memory 516).

Figure 6:
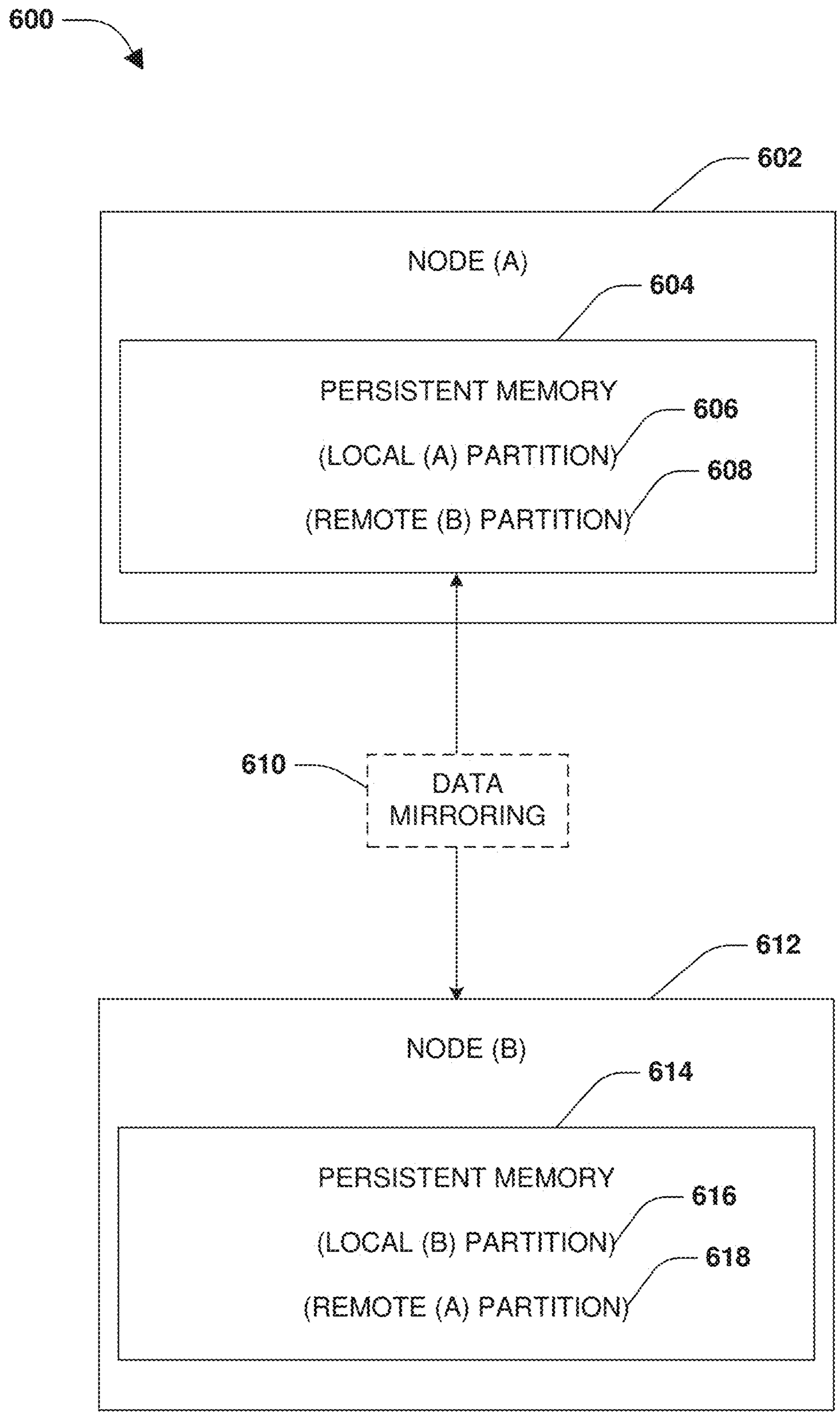
FIG. 6 is a block diagram illustrating an example system for implementing a file system format for persistent memory, where data is mirrored between persistent memories of two nodes.

FIG. 6 illustrates an example of a system 600 for implementing a file system format for persistent memory managed by a persistent memory storage tier, where data is mirrored between persistent memories of two nodes. A node (A) 602 may be partnered with a node (B) 612, which may correspond to any of the nodes of FIGS. 1-3 (e.g., node 130, node 132, node 202(1), node 206(1), etc.). For example, the node (A) 602 and the node (B) 612 may be part of a high availability node pairing such that if one node fails, then the surviving node takes over processing of subsequent I/O in place of the failed node. The node (A) 602 and the node (B) 612 may both have access to storage, such as block-addressable storage, in order to service the subsequent I/Os. However, data may also be stored by the node (A) 602 into a local (A) partition 606 of persistent memory 604 of the node (A) 602 and data may also be stored by the node (B) 612 into a local (B) partition 616 of persistent memory 614 of the node (B) 612. In the event of a failure, the surviving node will need access to data that was otherwise stored within the persistent memory of the failed node.

Accordingly, the persistent memory 604 of the node (A) 602 is partitioned into the local (A) partition 606 into which the node (A) 602 stores data and a remote (B) partition 608 into which the node (B) 612 mirrors 610 data from the local (B) partition 616. The persistent memory 614 of the node (B) 612 is partitioned into the local (B) partition 616 into which the node (B) 612 stores data and a remote (A) partition 618 into which the node (A) 602 mirrors 610 data from the local (A) partition 606. In this way, if a node fails, a surviving node will have up-to-date data within a remote partition of its persistent memory for servicing subsequent I/O in place of the failed node.

Figure 7:
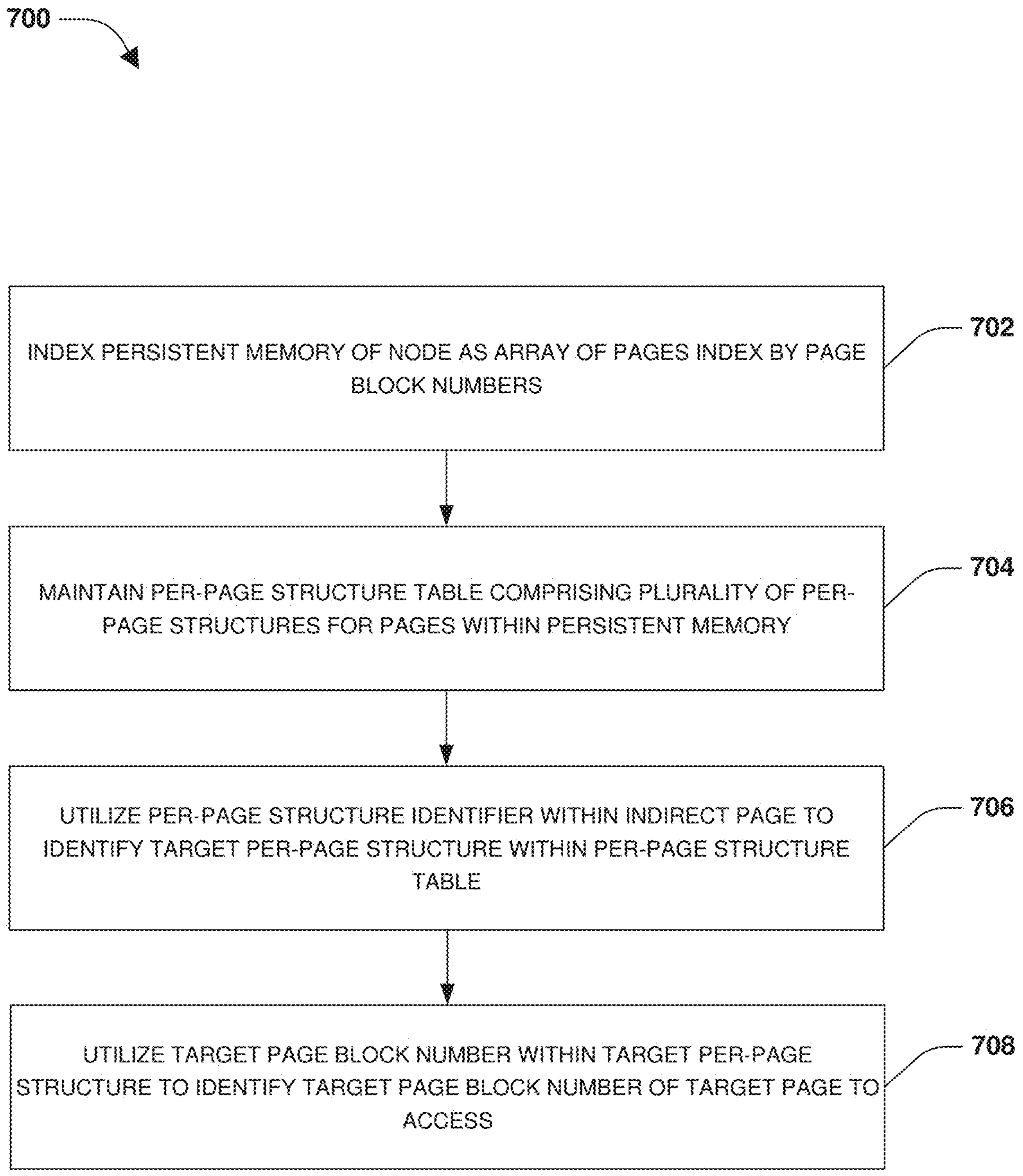
FIG. 7 is a flow chart illustrating an example method for implementing a file system format for persistent memory utilizing a per-page structure table.
Figure 8:
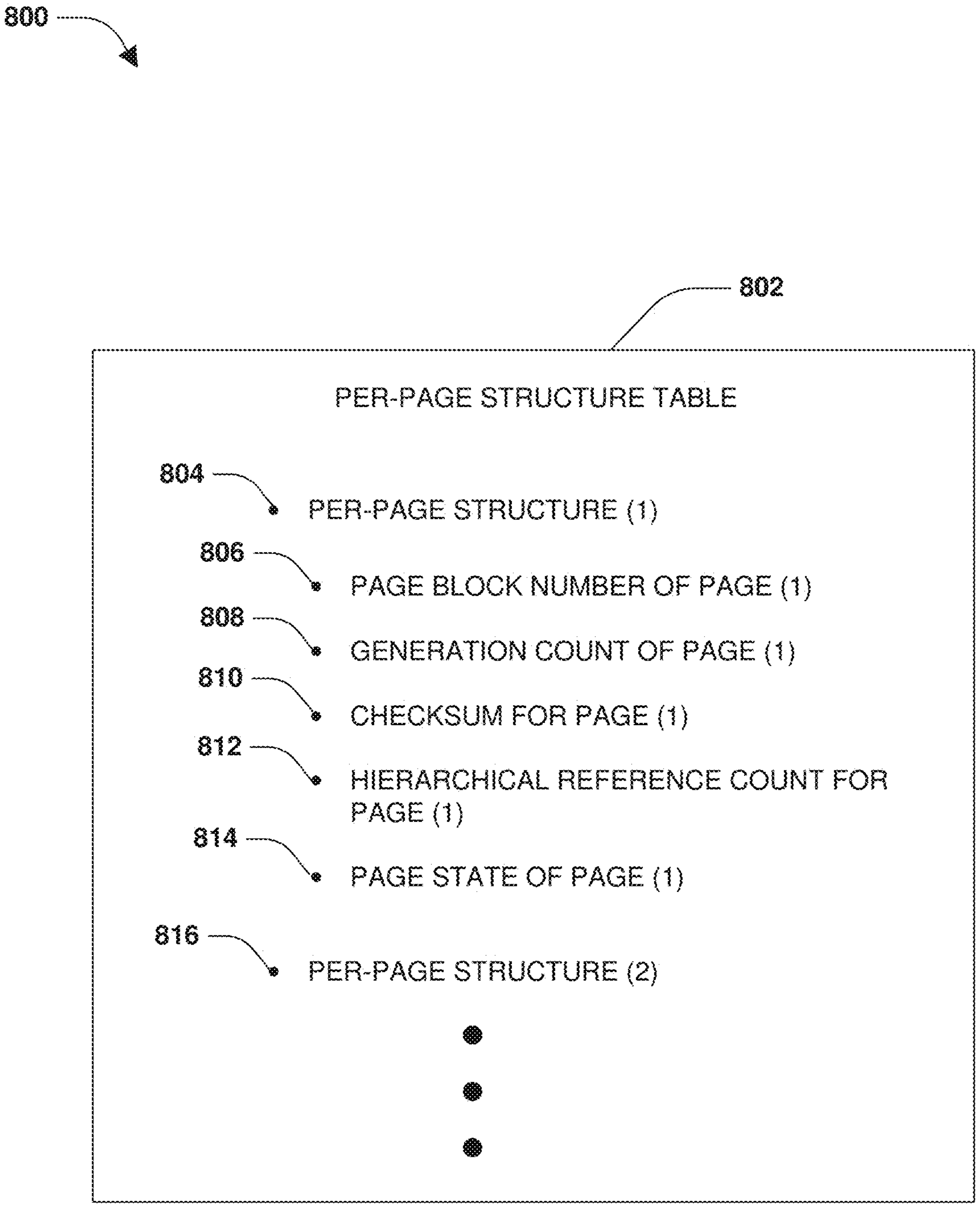
FIG. 8 is a block diagram illustrating an example system for implementing a file system format for persistent memory utilizing a per-page structure table.

One embodiment of implementing a file system format for persistent memory managed by a persistent memory storage tier utilizing a per-page structure table is illustrated by an exemplary method 700 of FIG. 7, which is further described in conjunction with system 800 of FIG. 8. At 702, persistent memory of a node is indexed as an array of pages indexed by page block numbers. At 704, a per-page structure table 802 is maintained. The per-page structure table 802 comprises a plurality of per-page structures for pages within the persistent memory. Each page within the persistent memory has a corresponding per-page structure.

In an example, the per-page structure table 802 comprises a first per-page structure 804 for a page (1) within the persistent memory, a second per-page structure 816 for a page (2) within the persistent memory, etc. The first per-page structure 804 comprises a page block number 806 of a child page reference by the page (1) (e.g., a page block number of a child block pointed to by an indirect page), a generation count 808 of the child page of the page (1), a checksum 810 of content within the page (1), a hierarchical reference count 812 for the page (1), a page state 814 of the page (1), and/or other information about the page (1).

The page block number 806 corresponds to a location of the page (1) within the persistent memory. The generation count 808 corresponds to a number of times the page (1) has been scavenged (e.g., evicted from the persistent memory). The hierarchical reference count 812 corresponds to a number of references to the page (1), such as by a volume (e.g., an active file system), file clones, and/or volume snapshots. The page state 814 may indicate whether the page (1) is free and not in use, is read cached and comprises content matching content within a lower tier of storage such as block-addressable storage of the node, and/or whether the page (1) is dirty and comprises data different than what is in the lower tier of storage. In an example, the page block number 806 and the generation count 808 are stored within 8 bytes, which is aligned within the persistent memory for atomic update (e.g., either both the page block number 806 and the generation count 808 will successfully be updated or will not be updated at all to prevent partial modified resulting from a failure of the node during update).

If the per-page structures utilize a variable mapping, then a per-page structure identifier within an indirect page (e.g., an indirect page within an inofile or an indirect page within a page tree) may be used to identify a target per-page structure within the per-page structure table 802 having the per-page structure identifier, at 706. At 708, the target per-page structure is evaluated to identify a target page block number of a target page to access within the persistent memory by an operation being executed by the node. If the per-page structures utilize a one to one mapping, then the per-page structure is at a fixed page block offset within the per-page structure table 802. Thus, an indirect page will comprise the page block number of a child block (a child page) to access, and thus the child block can be directly accessed from the indirect page instead of having to use a pre-page structure identifier to access a corresponding per-page structure having the page block number of the child block.

A scavenging process may be performed to remove data of pages from the persistent memory. When a page is scavenged, a generation count of the page within a per-page structure is incremented. This will invalidate references within indirect pages to the page because generation counts within the indirect pages (e.g., an indirect page has a child block's per-page structure generation count when inserted into the persistent memory) will not match the increased generation count within the per-page structure, and thus the references within the indirect pages will not be valid. In this way, the per-page structures are used to manage and store metadata of file system superblock pages, file system info pages, inofile indirect pages, user data pages, per-page structure array pages, and/or other data objects of the file system.

According to aspects of the present disclosure, an apparatus/machine/system for implementing a file system format for managing a persistent memory storage tier; a means for receiving, by a node, an operation comprising a file identifier and file system instance information; a means for evaluating a list of file system info objects to identify a file system info object matching the file system instance information; a means for traversing an inofile, identified by the file system info object as being associated with inodes of files within an instance of a file system targeted by the operation, to identify an inode matching the file identifier; a means for in response to the inode comprising an indicator specifying that the file is tiered into a persistent memory of the node, utilizing the inode to facilitate execution of the operation by a persistent memory storage tier upon the persistent memory; and a means for in response to the indicator specifying that the file is not tiered into the persistent memory of the node, routing the operation to a storage file system tier for execution by a storage file system upon storage associated with the node.

Figure 9:
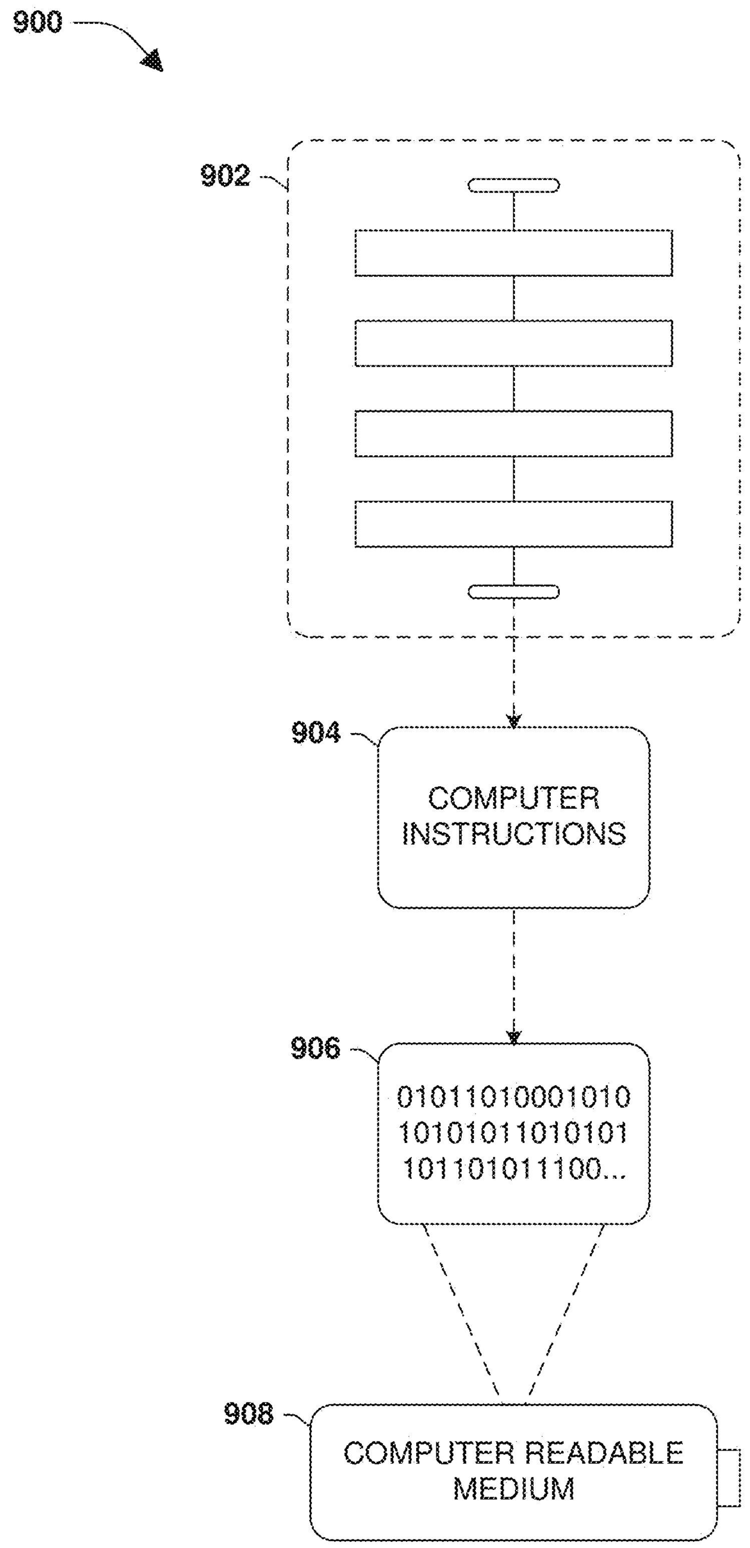
FIG. 9 is an example of a computer readable medium in which an embodiment of the invention may be implemented.

Still another embodiment involves a computer-readable medium 900 comprising processor-executable instructions configured to implement one or more of the techniques presented herein. An example embodiment of a computer-readable medium or a computer-readable device that is devised in these ways is illustrated in FIG. 9, wherein the implementation comprises a computer-readable medium 908, such as a compact disc-recordable (CD-R), a digital versatile disc-recordable (DVD-R), flash drive, a platter of a hard disk drive, etc., on which is encoded computer-readable data 906. This computer-readable data 906, such as binary data comprising at least one of a zero or a one, in turn comprises processor-executable computer instructions 904 configured to operate according to one or more of the principles set forth herein. In some embodiments, the processor-executable computer instructions 904 are configured to perform a method 902, such as at least some of the exemplary method 400 of FIG. 4 and/or at least some of the exemplary method 700 of FIG. 7, for example. In some embodiments, the processor-executable computer instructions 904 are configured to implement a system, such as at least some of the exemplary system 500 of FIG. 5, at least some of the exemplary system 600 of FIG. 6, and/or at least some of the exemplary system 800 of FIG. 8, for example. Many such computer-readable media are contemplated to operate in accordance with the techniques presented herein.

In an embodiment, the described methods and/or their equivalents may be implemented with computer executable instructions. Thus, in an embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on. In an embodiment, a computing device is implemented with one or more executable algorithms that are configured to perform any of the disclosed methods.

It will be appreciated that processes, architectures and/or procedures described herein can be implemented in hardware, firmware and/or software. It will also be appreciated that the provisions set forth herein may apply to any type of special-purpose computer (e.g., file host, storage server and/or storage serving appliance) and/or general-purpose computer, including a standalone computer or portion thereof, embodied as or including a storage system. Moreover, the teachings herein can be configured to a variety of storage system architectures including, but not limited to, a network-attached storage environment and/or a storage area network and disk assembly directly attached to a client or host computer. Storage system should therefore be taken broadly to include such arrangements in addition to any subsystems configured to perform a storage function and associated with other equipment or systems.

In some embodiments, methods described and/or illustrated in this disclosure may be realized in whole or in part on computer-readable media. Computer readable media can include processor-executable instructions configured to implement one or more of the methods presented herein, and may include any mechanism for storing this data that can be thereafter read by a computer system. Examples of computer readable media include (hard) drives (e.g., accessible via network attached storage (NAS)), Storage Area Networks (SAN), volatile and non-volatile memory, such as read-only memory (ROM), random-access memory (RAM), electrically erasable programmable read-only memory (EEPROM) and/or flash memory, compact disk read only memory (CD-ROM)s, CD-Rs, compact disk re-writeable (CD-RW)s, DVDs, cassettes, magnetic tape, magnetic disk storage, optical or non-optical data storage devices and/or any other medium which can be used to store data.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Furthermore, the claimed subject matter is implemented as a method, apparatus, or article of manufacture using standard application or engineering techniques to produce software, firmware, hardware, or any combination thereof to control a computer to implement the disclosed subject matter. The term "article of manufacture" as used herein is intended to encompass a computer application accessible from any computer-readable device, carrier, or media. Of course, many modifications may be made to this configuration without departing from the scope or spirit of the claimed subject matter.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, an application, or a computer. By way of illustration, both an application running on a controller and the controller can be a component. One or more components residing within a process or thread of execution and a component may be localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", or variants thereof are used, such terms are intended to be inclusive in a manner similar to the term "comprising".

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first set of information and a second set of information generally correspond to set of information A and set of information B or two different or two identical sets of information or the same set of information.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method comprising:

storing, by a persistent memory file system, pages of data within persistent memory of a node;

storing, by a storage file system, blocks of data within storage separate from the persistent memory;

selectively executing operations through the persistent memory file system and the storage file system; and mirroring data within the persistent memory of the node to a partner persistent memory of a partner node that is a partner of the node, wherein subsequent operations are rerouted from the node to the partner node for access to the partner persistent memory.

2. The method of claim 1, comprising:

partitioning the partner persistent memory into a local partition; and storing, by the partner node, data of I/O operations directed to the partner node.

3. The method of claim 1, comprising:

partitioning the partner persistent memory into a remote partition; and storing, by the partner node, data of rerouted I/O operations rerouted from the node to the partner node.

4. The method of claim 1, comprising:

partitioning the persistent memory into a local partition; and storing, by the node, data of I/O operations directed to the node.

5. The method of claim 1, comprising:

partitioning the persistent memory into a remote partition; and storing, by the node, data of rerouted I/O operations rerouted from the partner node to the node in response to the node failing.

6. The method of claim 1, comprising:

rerouting the subsequent operations from the node to the partner node in response to the node failing.

7. The method of claim 1, comprising:

mirroring data within the partner persistent memory of the partner node to the persistent memory of the node, wherein subsequent operations are rerouted from the partner node to the node for access to the persistent memory.

8. The method of claim 1, comprising:

partitioning the partner persistent memory into a local partition and a remote partner;

storing, by the partner node, data of I/O operations directed to the partner node; and storing, by the partner node, data of rerouted I/O operations rerouted from the node to the partner node.

9. The method of claim 1, comprising:

partitioning the persistent memory into a local partition and a remote partition;

storing, by the node, data of I/O operations directed to the node; and storing, by the node, data of rerouted I/O operations rerouted from the partner node to the node in response to the node failing.

10. A system, comprising:

a first node comprising a first persistent memory partitioned into a local partition;

a second node comprising a second persistent memory partitioned into remote partition; and a persistent memory storage tier, associated with the first persistent memory, that:

stores pages of data within the local partition of the first persistent memory of the first node;

selectively executing operations through a persistent memory file system and a storage file system that stores blocks of data within storage separate from the persistent memory; and mirroring data within the local partition of the first persistent memory of the first node to the remote partition of the second persistent memory of the second node that is a partner of the first node, wherein subsequent operations are rerouted from the first node to the second node for access to the remote partition of the second persistent memory based upon the first node failing.

11. The system of claim 10, wherein the first persistent memory is partitioned into a remote partition into which data from a local partition of the second persistent memory is mirrored.

12. The system of claim 11, wherein operations are rerouted from the second node to the first node for access to the remote partition of the first persistent memory based upon the second node failing.

13. The system of claim 10, wherein the persistent memory storage tier determines whether to execute an operation through the persistent memory file system of the storage file system based upon an access pattern history associated with a file targeted by the operation.

14. A non-transitory machine readable medium comprising instructions for performing a method, which when executed by a machine, causes the machine to:

store, by a persistent memory file system, pages of data within persistent memory of a node;

store, by a storage file system, blocks of data within storage separate from the persistent memory;

selectively execute operations through the persistent memory file system and the storage file system; and mirror data within the persistent memory of the node to a partner persistent memory of a partner node that is a partner of the node, wherein subsequent operations are rerouted from the node to the partner node for access to the partner persistent memory.

15. The non-transitory machine readable medium of claim 14, wherein the instructions cause the machine to:

partition the partner persistent memory into a local partition; and store, by the partner node, data of I/O operations directed to the partner node.

16. The non-transitory machine readable medium of claim 14, wherein the instructions cause the machine to:

partition the partner persistent memory into a remote partition; and store, by the partner node, data of rerouted I/O operations rerouted from the node to the partner node.

17. The non-transitory machine readable medium of claim 14, wherein the instructions cause the machine to:

partition the persistent memory into a local partition; and store, by the node, data of I/O operations directed to the node.

18. The non-transitory machine readable medium of claim 14, wherein the instructions cause the machine to:

partition the persistent memory into a remote partition; and store, by the node, data of rerouted I/O operations rerouted from the partner node to the node in response to the node failing.

19. The non-transitory machine readable medium of claim 14, wherein the instructions cause the machine to:

reroute the subsequent operations from the node to the partner node in response to the node failing.

20. The non-transitory machine readable medium of claim 14, wherein the instructions cause the machine to:

mirror data within the partner persistent memory of the partner node to the persistent memory of the node, wherein subsequent operations are rerouted from the partner node to the node for access to the persistent memory.

* * * * *